US012665606B2

(12) United States Patent
Wu et al.

(10) Patent No.: US 12,665,606 B2
(45) Date of Patent: Jun. 23, 2026

(54) SAMPLING SYSTEM WITH SETTLING ERROR CANCELLATION

(71) Applicant: Airoha Technology Corp., Hsinchu City (TW)

(72) Inventors: Min-Hua Wu, Hsinchu County (TW); Chung-Ru Wu, Taoyuan City (TW); Yi-Keng Hsieh, Hsinchu County (TW)

(73) Assignee: Airoha Technology Corp., Hsinchu City (TW)

( * ) Notice: Subject to any disclaimer, the term of this patent is extended or adjusted under 35 U.S.C. 154(b) by 123 days.

(21) Appl. No.: 18/826,215

(22) Filed: Sep. 6, 2024

(65) Prior Publication Data

US 2026/0074705 A1 Mar. 12, 2026

(51) Int. Cl.
*H03M 1/06* (2006.01)
(52) U.S. Cl.
CPC .................................. *H03M 1/0604* (2013.01)
(58) Field of Classification Search
CPC .................................................. H03M 1/0604
USPC .................................. 341/118, 122, 155, 172
See application file for complete search history.

(56) References Cited

U.S. PATENT DOCUMENTS 7,034,737 B1 * 4/2006 Huang .................. H03M 1/147
                                                341/172
7,683,819 B2 3/2010 Kurauchi 7,868,797 B2 * 1/2011 Ito ........................ G11C 27/026
                                                341/172
2010/0283652 A1 11/2010 Nadiguebe
2013/0076546 A1 3/2013 Wan

FOREIGN PATENT DOCUMENTS

TW           I535221 B      5/2016
WO           99/57671       11/1999

OTHER PUBLICATIONS

Ali, A 180mW 56Gb/s DSP-Based Transceiver for High-Density IOs in Data Center Switches in 7nm FinFET Technology, ISSCC 2019/ Session 6 / Ultra-High-Speed Wireline / 6.4, pp. 118-119 and a page including Figure 6.4.7, 2019.
Loi, A 400Gb/s Transceiver for PAM-4 Optical Direct-Detect Application in 16nm FinFET, ISSCC 2019 / Session 6 / Ultra-High-Speed Wireline / 6.5, pp. 120-121 and a page including Figure 6.5.7, 2019.

* cited by examiner

*Primary Examiner* — Khai M Nguyen
(74) *Attorney, Agent, or Firm* — Winston Hsu

(57) ABSTRACT
A sampling system includes a sampler circuit, a first settling error canceller circuit, and a second settling error canceller circuit. During a first phase, each of the sampler circuit and the first settling error canceller circuit perform a sampling operation, and the second settling error canceller circuit performs a holding operation. During a second phase, the sampler circuit and the second settling error canceller circuit perform charge redistribution, and the first settling error canceller circuit performs a holding operation. During a third phase, each of the sampler circuit and the second settling error canceller circuit performs a sampling operation, and the first settling error canceller circuit performs a holding operation. During a fourth phase, the sampler circuit and the first settling error canceller circuit perform charge redistribution, and the second settling error canceller circuit performs a holding operation.

21 Claims, 11 Drawing Sheets

SAMPLING SYSTEM WITH SETTLING ERROR CANCELLATION

BACKGROUND OF THE INVENTION

1. Field of the Invention

The present invention relates to sampling an analog input for following processing, and more particularly, to a sampling system with settling error cancellation.

2. Description of the Prior Art

A polyphase time-interleaved sampler is an essential building block between a continuous-time linear equalizer (CTLE) and an analog-to-digital converter (ADC) in a mainstream digital signal processor (DSP) based high speed receiver analog front-end. However, when a voltage $V_f(t1)$ to be sampled at a current sampling time point t1 is different from a voltage $V_O(t0)$ obtained from sampling at a previous sampling time point to, charging/discharging of a sampling capacitor is required during sampling of the voltage $V_f(t1)$. A voltage $V_O(t1)$ obtained from sampling at the current sampling time point t1 may be deviated from the voltage $V_f(t1)$ due to a settling error resulting from incomplete settling. For example, when a negative settling error occurs, the voltage $V_O(t1)$ held by the sampling capacitor at the end of the current sampling phase is lower than the voltage $V_f(t1)$. For another example, when a positive settling error occurs, the voltage $V_O(t1)$ held by the sampling capacitor at the end of the current sampling phase is higher than the voltage $V_f(t1)$. Specifically, the settling error resulting from incomplete settling due to the voltage $V_O(t0)$ may be represented by $(1-k)*V_O(t0)$, where $k=1-e^{-t/\tau}$ and $\tau$ is an RC time constant of the sampler. The error factor k is strongly related to a preceding voltage buffer's driving ability, an effective turn-on resistance of a switch of the sampler, and a size of the sampling capacitor of the sampler. This also means that the error factor k may vary under different process corner, supply voltage, and temperature. One common approach is to employ a voltage buffer (e.g., source follower) with strong driving capability. However, a voltage buffer with strong driving capability is a power-hungry device, which results in higher power consumption. Another common approach is to provide a reset phase to clear current memorized value before the new sampling. However, the reset window is short under a high-speed sampling operation, and a large-sized reset switch is required. Still another common approach is to cancel the settling error by a finite impulse response (FIR) filter or infinite impulse response (IIR) filter in the DSP at the cost of higher noise/power.

Thus, there is a need for a sampling system with an innovative settling error cancellation design.

SUMMARY OF THE INVENTION

One of the objectives of the claimed invention is to provide a sampling system with settling error cancellation, where additional sampling capacitors are introduced to form switched-capacitor based settling error canceller circuits.

According to an aspect of the present invention, an exemplary sampling system is disclosed. The exemplary sampling system includes a sampler circuit, a first settling error canceller circuit, and a second settling error canceller circuit. The sampler circuit is coupled between an input port and an output port of the sampling system, and comprises at least one sampling capacitor. The first settling error canceller circuit is coupled between the input port and the output port of the sampling system, and comprises at least one first sampling capacitor. The second settling error canceller circuit is coupled between the input port and the output port of the sampling system, and comprises at least one second sampling capacitor. During a first phase of a settling error cancellation operation, the sampler circuit is arranged to sample a voltage input derived from the input port at the at least one sampling capacitor, the first settling error canceller circuit is arranged to sample the voltage input derived from the input port at the at least one first sampling capacitor, and the second settling error canceller circuit is arranged to hold its sampling result at the at least one second sampling capacitor. During a second phase of the settling error cancellation operation that is a next phase of the first phase, the sampler circuit and the second settling error canceller circuit are arranged to perform charge redistribution between the at least one sampling capacitor and the at least one second sampling capacitor, and the first settling error canceller circuit is arranged to hold its sampling result at the at least one first sampling capacitor. During a third phase of the settling error cancellation operation that is a next phase of the second phase, the sampler circuit is arranged to sample the voltage input derived from the input port at the at least one sampling capacitor, the second settling error canceller circuit is arranged to sample the voltage input derived from the input port at the at least one second sampling capacitor, and the first settling error canceller circuit is arranged to hold its sampling result at the at least one first sampling capacitor. During a fourth phase of the settling error cancellation operation that is a next phase of the third phase, the sampler circuit and the first settling error canceller circuit are arranged to perform charge redistribution between the at least one sampling capacitor and the at least one first sampling capacitor, and the second settling error canceller circuit is arranged to hold its sampling result at the at least one second sampling capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
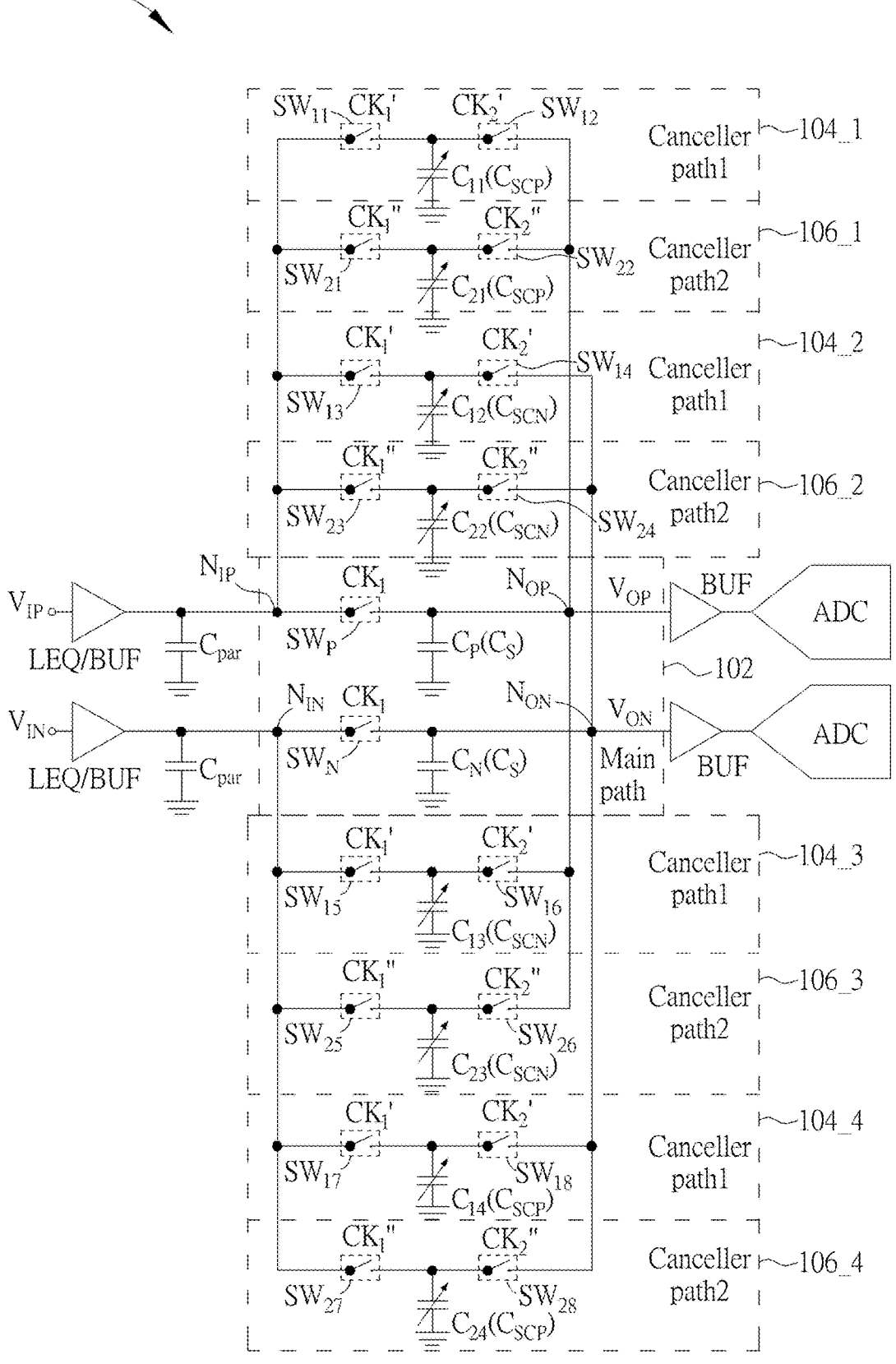
FIG. 1 is a diagram illustrating a first sampling system with settling error cancellation according to an embodiment of the present invention.

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a settling error cancellation design that uses additional sampling capacitor(s) to form a switched-capacitor based settling error canceller circuit at each canceller path, where the switched-capacitor based settling error canceller circuit injects memorized information of a current sampling phase to cancel a settling error resulting from incomplete settling that occurs in a next sampling phase. Specifically, settling error cancellation is achieved by charge redistribution between additional sampling capacitor(s) of the canceller path and original sampling capacitor(s) of a main path. Hence, the settling error $(1-k)$ $*V_O(t0)$ can be removed by adjusting the additional sampling capacitor(s) to proper capacitance value(s). For example, before settling error cancellation is enabled, polarity and magnitude of the settling error $(1-k)*V_O(t0)$ of a sampler circuit at the main path can be estimated through an online training process, for example, by using a correlator and a minimum mean square error loop. In practice, any means capable of estimating polarity and magnitude of the settling error $(1-k)*V_O(t0)$ of the sampler circuit can be employed. Since the present invention is focused on settling error cancelation, further description of the settling error estimation is omitted here for brevity.

The additional sampling capacitor(s) may be implemented using variable capacitor(s), and may be properly adjusted according to the polarity and/or the magnitude of the settling error $(1-k)*V_O(t0)$. Since the settling error $(1-k)*V_O(t0)$ can be estimated through an online training process, the settling error cancellation can also overcome process, voltage, temperature (PVT) variation. In some embodiments, the switched-capacitor based settling error canceller circuit may also be controlled according to the polarity of the settling error $(1-k)*V_O(t0)$. Furthermore, the proposed settling error cancellation design may be embedded in an existing multi-phase time-interleaved sampling network. In this way, the problem of polyphase sampling clock generation required by switched-capacitor based settling error canceller circuits at canceller paths can be easily resolved.

The concept of the proposed settling error cancellation design is briefly described as below. A sampling system includes a sampler circuit (which is located at a main path), a first settling error canceller circuit (which is located at one canceller path), and a second settling error canceller circuit (which is located at another canceller path). The first settling error canceller circuit and the second settling error canceller circuit perform settling error cancellation in a time-interleaved fashion. For example, the first settling error canceller circuit is used for applying settling error cancellation to sampling at to, the second settling error canceller circuit is used for applying settling error cancellation to sampling at t1 (t1>t0), the first settling error canceller circuit is used for applying settling error cancellation to sampling at t2 (t2>t1), the second settling error canceller circuit is used for applying settling error cancellation to sampling at t3 (t3>t2), and so on.

The settling error cancellation operation can be divided into four phases. During a first phase, each of the sampler circuit and the first settling error canceller circuit perform a sampling operation, and the second settling error canceller circuit performs a holding operation. Specifically, the sampler circuit is arranged to sample a voltage input (which is derived from an input port of the sampling system) at sampling capacitor(s) of the sampler circuit, the first settling error canceller circuit is arranged to sample the voltage input (which is derived from the input port of the sampling system) at sampling capacitor(s) of the first settling error canceller circuit, and the second settling error canceller circuit is arranged to hold its sampling result at sampling capacitor(s) of the second settling error canceller circuit.

During a second phase following the first phase, the sampler circuit and the second settling error canceller circuit perform charge redistribution for settling error cancellation, and the first settling error canceller circuit performs a holding operation. Specifically, the sampler circuit and the second settling error canceller circuit are arranged to perform charge redistribution between sampling capacitor(s) of the sampler circuit and sampling capacitor(s) of the second settling error canceller circuit, and the first settling error canceller circuit is arranged to hold its sampling result at sampling capacitor(s) of the first settling error canceller circuit.

During a third phase following the second phase, each of the sampler circuit and the second settling error canceller circuit performs a sampling operation, and the first settling error canceller circuit performs a holding operation. Specifically, the sampler circuit is arranged to sample the voltage input (which is derived from the input port of the sampling system) at sampling capacitor(s) of the sampler circuit, the second settling error canceller circuit is arranged to sample the voltage input (which is derived from the input port of the sampling system) at sampling capacitor(s) of the second settling error canceller circuit, and the first settling error canceller circuit is arranged to hold its sampling result at sampling capacitor(s) of the first settling error canceller circuit.

During a fourth phase following the third phase, the sampler circuit and the first settling error canceller circuit perform charge redistribution for settling error cancellation, and the second settling error canceller circuit performs a holding operation. Specifically, the sampler circuit and the first settling error canceller circuit are arranged to perform charge redistribution between sampling capacitor(s) of the sampler circuit and sampling capacitor(s) of the first settling error canceller circuit, and the second settling error canceller circuit is arranged to hold its sampling result at sampling capacitor(s) of the second settling error canceller circuit.

After the fourth phase is completed, the settling error cancellation operation goes back to the first phase for another round of first phase, second phase, third phase, and fourth phase.

For better comprehension of technical features of the proposed settling error cancellation design, several sampling systems with settling error cancellation are described as below with reference to the accompanying drawings.

FIG. 1 is a diagram illustrating a first sampling system with settling error cancellation according to an embodiment of the present invention. The sampling system 100 includes a sampler circuit 102 located at a main path, a first settling error canceller circuit (which includes a plurality of partial circuits 104_1, 104_2, 104_3, and 104_4) located at a first canceller path (labeled by "canceller path1"), and a second settling error canceller circuit (which includes a plurality of partial circuits 106_1, 106_2, 106_3, and 106_4) located at a second canceller path (labeled by "canceller path2"). Each of the sampler circuit 102, the first settling error canceller circuit, and the second settling error canceller circuit is coupled between an input port and an output port of the sampling system 100. In this embodiment, the sampling system 100 is a differential operation network. Hence, the input port is a differential input port having a positive input node $N_{IP}$ and a negative input node $N_{IN}$, the output port is a differential output port having a positive output node $N_{OP}$ and a negative output node $N_{ON}$, a voltage input derived from the input port is a differential voltage input having a positive voltage signal $V_{IP}$ (which is driven by one linear equalizer/buffer (LEQ/BUF)) and a negative voltage signal $V_{IN}$ (which is driven by another LEQ/BUF), and a voltage output generated from the output port is a differential voltage output having a positive voltage signal $V_{OP}$ (which is provided to one ADC via one BUF) and a negative voltage signal $V_{ON}$ (which is provided to another ADC via another BUF).

The sampler circuit 102 includes a plurality of sampling capacitors $C_P$ and $C_N$ and a plurality of switches (e.g., transistor switches) $SW_P$ and $SW_N$. The sampling capacitor $C_P$ has a first end (top plate) and a second end (bottom plate), where the second end is coupled to a reference voltage (e.g., ground voltage GND). The sampling capacitor $C_N$ has a first end (top plate) and a second end (bottom plate), where the second end is coupled to the reference voltage (e.g., ground voltage GND). The sampling capacitors $C_P$ and $C_N$ have the same capacitance value $C_S$. The switch $SW_P$ is controlled by a clock signal $CK_1$, and coupled between the first end of the sampling capacitor $C_P$ and the positive input node $N_{IP}$. The switch $SW_N$ is controlled by the clock signal $CK_1$, and coupled between the first end of the sampling capacitor $C_N$ and the negative input node $N_{IN}$.

The first settling error canceller circuit includes a plurality of sampling capacitors (e.g., variable capacitors) $C_{11}$, $C_{12}$, $C_{13}$, $C_{14}$ and a plurality of switches (e.g., transistor switches) $SW_{11}$, $SW_{12}$, $SW_{13}$, $SW_{14}$, $SW_{15}$, $SW_{16}$, $SW_{17}$, $SW_{18}$, where the sampling capacitors $C_{11}$ and $C_{14}$ have the same capacitance value $C_{SCP}$, and the sampling capacitors $C_{12}$ and $C_{13}$ have the same capacitance value $C_{SCN}$ ($C_{SCN} \neq C_{SCP}$). The sampling capacitor $C_{11}$ has a first end (top plate) and a second end (bottom plate), wherein the second end is coupled to the reference voltage (e.g., ground voltage GND). The sampling capacitor $C_{12}$ has a first end (top plate) and a second end (bottom plate), wherein the second end is coupled to the reference voltage (e.g., ground voltage GND). The sampling capacitor $C_{13}$ has a first end (top plate) and a second end (bottom plate), wherein the second end is coupled to the reference voltage (e.g., ground voltage GND). The sampling capacitor $C_{14}$ has a first end (top plate) and a second end (bottom plate), wherein the second end is coupled to the reference voltage (e.g., ground voltage GND).

The switch $SW_{11}$ is controlled by a clock signal $CK_1'$, and coupled between the first end of the sampling capacitor $C_{11}$ and the positive input node $N_{IP}$. The switch $SW_{12}$ is controlled by a clock signal $CK_2'$, and coupled between the first end of the sampling capacitor $C_{11}$ and the positive output node $N_{OP}$. The switch $SW_{13}$ is controlled by the clock signal $CK_1'$, and coupled between the first end of the sampling capacitor $C_{12}$ and the positive input node $N_{IP}$. The switch $SW_{14}$ is controlled by the clock signal $CK_2'$, and coupled between the first end of the sampling capacitor $C_{12}$ and the negative output node $N_{ON}$. The switch $SW_{15}$ is controlled by the clock signal $CK_1'$, and coupled between the first end of the sampling capacitor $C_{13}$ and the negative input node $N_{IN}$. The switch $SW_{16}$ is controlled by the clock signal $CK_2'$, and coupled between the first end of the sampling capacitor $C_{13}$ and the positive output node $N_{OP}$. The switch $SW_{17}$ is controlled by the clock signal $CK_1'$, and coupled between the first end of the sampling capacitor $C_{14}$ and the negative input node $N_{IN}$. The switch $SW_{18}$ is controlled by the clock signal $CK_2'$, and coupled between the first end of the sampling capacitor $C_{14}$ and the negative output node $N_{ON}$.

The second settling error canceller circuit includes a plurality of sampling capacitors (e.g., variable capacitors) $C_{21}$, $C_{22}$, $C_{23}$, $C_{24}$ and a plurality of switches (e.g., transistor switches) $SW_{21}$, $SW_{22}$, $SW_{23}$, $SW_{24}$, $SW_{25}$, $SW_{26}$, $SW_{27}$, $SW_{28}$, where the sampling capacitors $C_{21}$ and $C_{24}$ have the same capacitance value $C_{SCP}$, and the sampling capacitors $C_{22}$ and $C_{23}$ have the same capacitance value $C_{SCN}$ ($C_{SCN} \neq C_{SCP}$). The sampling capacitor $C_{21}$ has a first end (top plate) and a second end (bottom plate), wherein the second end is coupled to the reference voltage (e.g., ground voltage GND). The sampling capacitor $C_{22}$ has a first end (top plate) and a second end (bottom plate), wherein the second end is coupled to the reference voltage (e.g., ground voltage GND). The sampling capacitor $C_{23}$ has a first end (top plate) and a second end (bottom plate), wherein the second end is coupled to the reference voltage (e.g., ground voltage GND). The sampling capacitor $C_{24}$ has a first end (top plate) and a second end (bottom plate), wherein the second end is coupled to the reference voltage (e.g., ground voltage GND).

The switch $SW_{21}$ is controlled by a clock signal $CK_1''$, and coupled between the first end of the sampling capacitor $C_{21}$ and the positive input node $N_{IP}$. The switch $SW_{22}$ is controlled by a clock signal $CK_2''$, and coupled between the first end of the sampling capacitor $C_{21}$ and the positive output node $N_{OP}$. The switch $SW_{23}$ is controlled by the clock signal $CK_1''$, and coupled between the first end of the sampling capacitor $C_{22}$ and the positive input node $N_{IP}$. The switch $SW_{24}$ is controlled by the clock signal $CK_2''$, and coupled between the first end of the sampling capacitor Ca and the negative output node $N_{ON}$. The switch $SW_{25}$ is controlled by the clock signal $CK_1''$, and coupled between the first end of the sampling capacitor $C_{23}$ and the negative input node $N_{IN}$. The switch $SW_{26}$ is controlled by the clock signal $CK_2''$, and coupled between the first end of the sampling capacitor $C_{23}$ and the positive output node $N_{OP}$. The switch $SW_{27}$ is controlled by the clock signal $CK_1''$, and coupled between the first end of the sampling capacitor $C_{24}$ and the negative input node $N_{IN}$. The switch $SW_{28}$ is controlled by the clock signal $CK_2''$, and coupled between the first end of the sampling capacitor $C_{24}$ and the negative output node $N_{ON}$.

Figure 2:
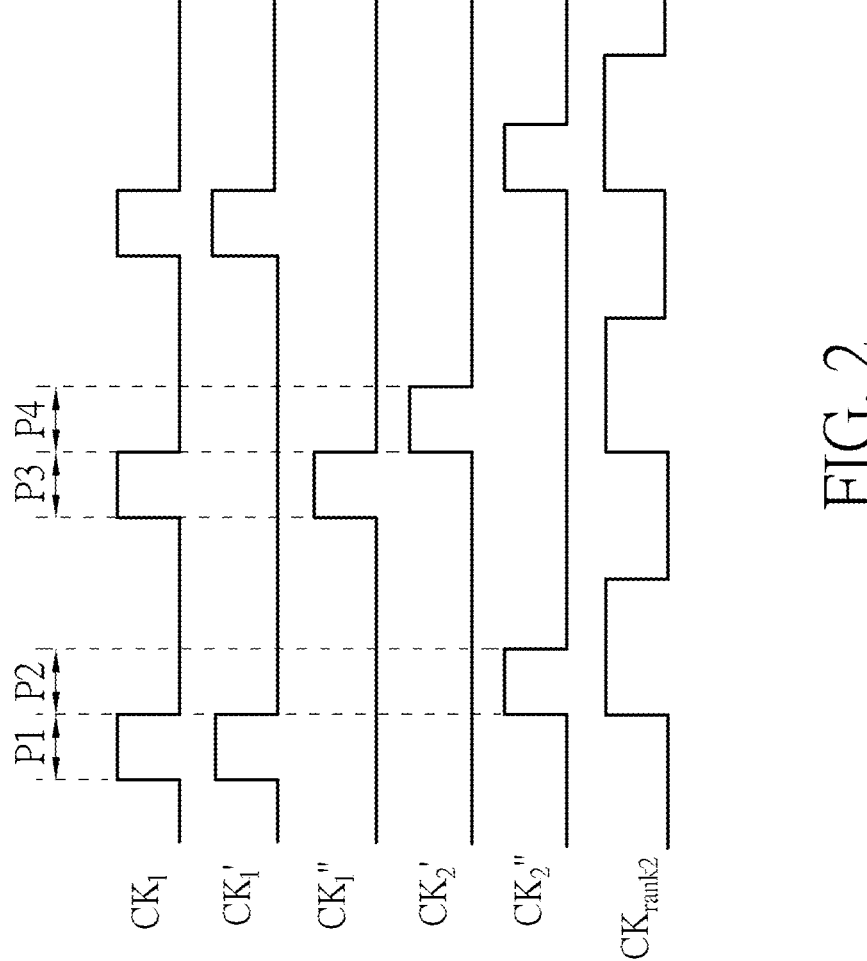
FIG. 2 is a diagram illustrating waveforms of clock signals used for controlling switches of the sampling system shown in FIG. 1 according to an embodiment of the present invention.

As mentioned above, the settling error cancellation operation can be divided into four phases P1, P2, P3, P4. Specifically, the phases P1, P2, P3, P4 are enabled sequentially and cyclically, resulting in a sequence of . . . $\rightarrow$P1$\rightarrow$P2$\rightarrow$P3$\rightarrow$P4$\rightarrow$P1$\rightarrow$P2$\rightarrow$P3$\rightarrow$P4$\rightarrow$ . . . . FIG. 2 is a diagram illustrating waveforms of clock signals used for controlling switches of the sampling system 100 according to an embodiment of the present invention, where the clock signal $CK_{rank2}$ shown in FIG. 2 is used for controlling the ADC. During the first phase P1 of the settling error cancellation operation, the switches $SW_P$, $SW_N$, $SW_{11}$, $SW_{13}$, $SW_{15}$, $SW_{17}$ are switched on, and the switches $SW_{12}$, $SW_{14}$, $SW_{16}$, $SW_{18}$, $SW_{21}$-$SW_{28}$ are switched off. During the second phase P2 of the settling error cancellation operation, the switches $SW_{22}$, $SW_{24}$, $SW_{26}$, $SW_{28}$ are switched on, and the switches $SW_P$, $SW_N$, $SW_{11}$-$SW_{18}$, $SW_{21}$, $SW_{23}$, $SW_{25}$, $SW_{27}$ are switched off. During the third phase P3 of the settling error cancellation operation, the switches $SW_P$, $SW_N$, $SW_{21}$, $SW_{23}$, $SW_{25}$, $SW_{27}$ are switched on, and the switches $SW_{22}$, $SW_{24}$, $SW_{26}$, $SW_{28}$, $SW_{11}$-$SW_{18}$ are switched off. During the fourth phase P4 of the settling error cancellation operation, the switches $SW_{12}$, $SW_{14}$, $SW_{16}$, $SW_{18}$ are switched on, and the switches $SW_P$, $SW_N$, $SW_{21}$-$SW_{28}$, $SW_{11}$, $SW_{13}$, $SW_{15}$, $SW_{17}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{C_{SCP} - C_{SCN}}{C_S + C_{SCP} + C_{SCN}}.$$

In a case where the sampler circuit 102 at the main path suffers a settling error $(1-k)*V_O(t0)$ with negative polarity, the capacitance value $C_{SCP}$ is set to be larger than the capacitance value $C_{SCN}$, which results in $(C_{SCP}-C_{SCN})>0$. In addition, the capacitance values $C_{SCP}$ and $C_{SCN}$ are properly set to ensure that a fraction of the memorized information injected by an active settling error canceller circuit (i.e., one of the first settling error canceller circuit and the second settling error canceller circuit) can cancel the settling error $(1-k)*V_O(t0)$. In another case where the sampler circuit 102 at the main path suffers a settling error $(1-k)*V_O(t0)$ with positive polarity, the capacitance value $C_{SCP}$ is set to be smaller than that of the capacitance value $C_{SCN}$, which results in $(C_{SCP}-C_{SCN})<0$. In addition, the capacitance values $C_{SCP}$ and $C_{SCN}$ are properly set to ensure that a fraction of the memorized information injected by an active settling error canceller circuit (i.e., one of the first settling error canceller circuit and the second settling error canceller circuit) can cancel the settling error $(1-k)*V_O(t0)$. To put it simply, since the polarity and magnitude of the settling error $(1-k)*V_O(t0)$ of the sampler circuit 102 can be estimated through an online training process, the polarity and magnitude of cancellation weighting $$\frac{C_{SCP} - C_{SCN}}{C_S + C_{SCP} + C_{SCN}}$$

can be properly set by tuning the capacitance values $C_{SCP}$ and $C_{SCN}$ according to the polarity and magnitude of the settling error $(1-k)*V_O(t0)$ to be cancelled.

Figure 3:
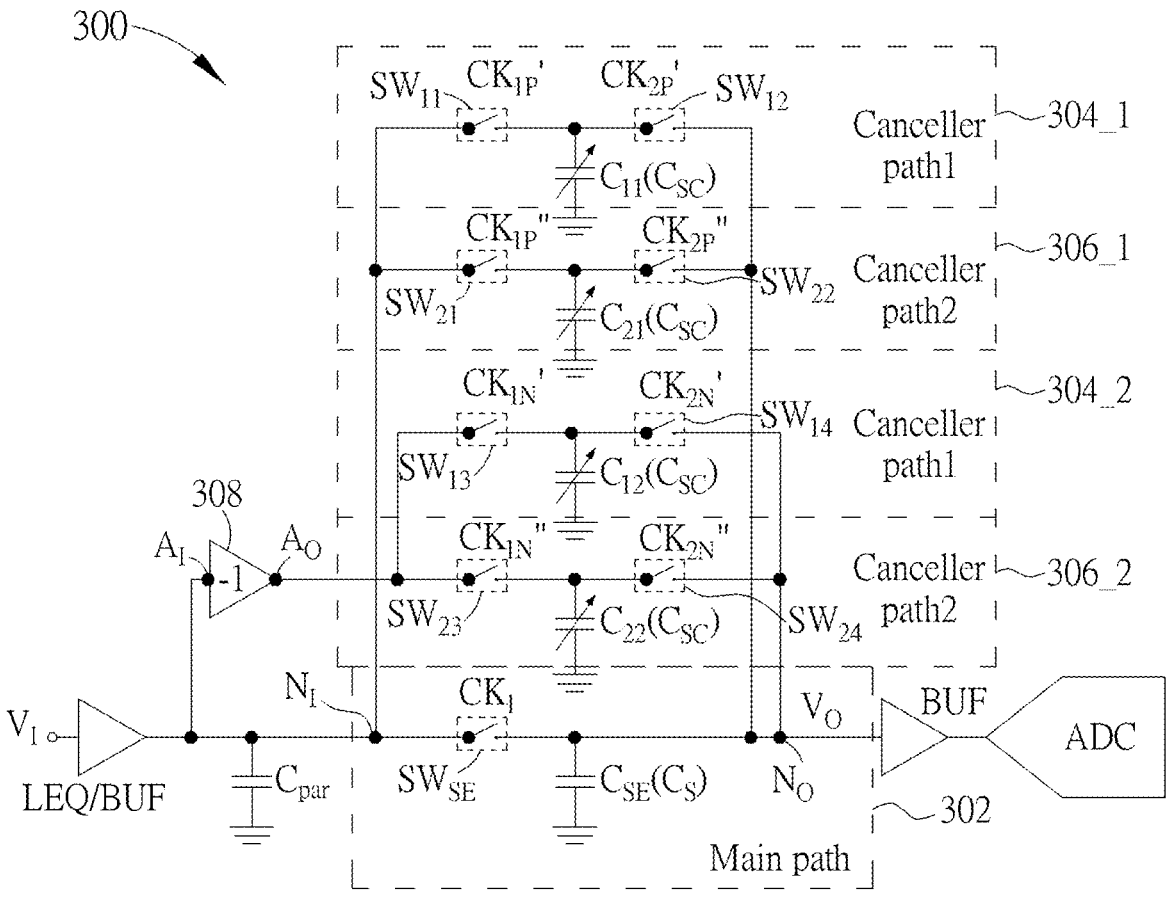
FIG. 3 is a diagram illustrating a second sampling system with settling error cancellation according to an embodiment of the present invention.

FIG. 3 is a diagram illustrating a second sampling system with settling error cancellation according to an embodiment of the present invention. The sampling system 300 includes a sampler circuit 302 located at a main path, a first settling error canceller circuit (which includes a plurality of partial circuits 304_1 and 304_2) located at a first canceller path (labeled by "canceller path1"), a second settling error canceller circuit (which includes a plurality of partial circuits 306_1 and 306_2) located at a second canceller path (labeled by "canceller path2"), and a negative-unity-gain amplifier 308. Each of the sampler circuit 302, the first settling error canceller circuit, and the second settling error canceller circuit is coupled between an input port and an output port of the sampling system 300. In this embodiment, the sampling system 300 is a single-ended operation network. Hence, the input port is a single-ended input port having a single input node $N_I$, the output port is a single-ended output port having a single output node $N_O$, a voltage input derived from the input port is a single-ended voltage input having a single voltage signal $V_I$ (which is driven by one LEQ/BUF), and a voltage output generated from the output port is a single-ended voltage output having a single voltage signal $V_O$ (which is provided to one ADC via one BUF).

The negative-unity-gain amplifier 308 has an amplifier input node $A_I$ and an amplifier output node $A_O$, wherein the amplifier input node $A_I$ is coupled to the input node $N_I$. The sampler circuit 302 includes a sampling capacitor $C_{SE}$ and a switch (e.g., transistor switch) $SW_{SE}$. The sampling capacitor $C_{SE}$ has a first end (top plate) and a second end (bottom plate), where the second end is coupled to a reference voltage (e.g., ground voltage GND). The sampling capacitor $C_{SE}$ has a capacitance value $C_S$. The switch $SW_{SE}$ is controlled by a clock signal $CK_1$, and coupled between the first end of the sampling capacitor $C_{SE}$ and the input node $N_I$.

The first settling error canceller circuit includes a plurality of sampling capacitors (e.g., variable capacitors) $C_{11}$, $C_{12}$ and a plurality of switches (e.g., transistor switches) $SW_{11}$, $SW_{12}$, $SW_{13}$, $SW_{14}$, where the sampling capacitors $C_{11}$ and $C_{12}$ have the same capacitance value $C_{SC}$. The sampling capacitor $C_{11}$ has a first end (top plate) and a second end (bottom plate), wherein the second end is coupled to the reference voltage (e.g., ground voltage GND). The sampling capacitor Cis has a first end (top plate) and a second end (bottom plate), wherein the second end is coupled to the reference voltage (e.g., ground voltage GND).

The switch $SW_{11}$ is controlled by a clock signal $CK_{1P}'$, and coupled between the first end of the sampling capacitor $C_{11}$ and the input node $N_I$. The switch $SW_{12}$ is controlled by a clock signal $CK_{2P}'$, and coupled between the first end of the sampling capacitor $C_{11}$ and the output node $N_O$. The switch $SW_{13}$ is controlled by the clock signal $CK_{1N}'$, and coupled between the first end of the sampling capacitor $C_{12}$ and the amplifier output node $A_O$. The switch $SW_{14}$ is controlled by the clock signal $CK_{2N}'$, and coupled between the first end of the sampling capacitor $C_{12}$ and the output node $N_O$.

The second settling error canceller circuit includes a plurality of sampling capacitors (e.g., variable capacitors) $C_{21}$, $C_{22}$ and a plurality of switches (e.g., transistor switches)

$SW_{21}$, $SW_{22}$, $SW_{23}$, $SW_{24}$, where the sampling capacitors $C_{21}$ and $C_{22}$ have the same capacitance value $C_{SC}$. The sampling capacitor $C_{21}$ has a first end (top plate) and a second end (bottom plate), wherein the second end is coupled to the reference voltage (e.g., ground voltage GND). The sampling capacitor Ce has a first end (top plate) and a second end (bottom plate), wherein the second end is coupled to the reference voltage (e.g., ground voltage GND).

The switch $SW_{21}$ is controlled by a clock signal $CK_{1P}''$, and coupled between the first end of the sampling capacitor $C_{21}$ and the input node $N_I$. The switch $SW_{22}$ is controlled by a clock signal $CK_{2P}''$, and coupled between the first end of the sampling capacitor $C_{21}$ and the output node $N_O$. The switch $SW_{23}$ is controlled by the clock signal $CK_{1N}''$, and coupled between the first end of the sampling capacitor $C_{22}$ and the amplifier output node $A_O$. The switch $SW_{24}$ is controlled by the clock signal $CK_{2N}''$, and coupled between the first end of the sampling capacitor $C_{22}$ and the output node $N_O$.

Figure 4:
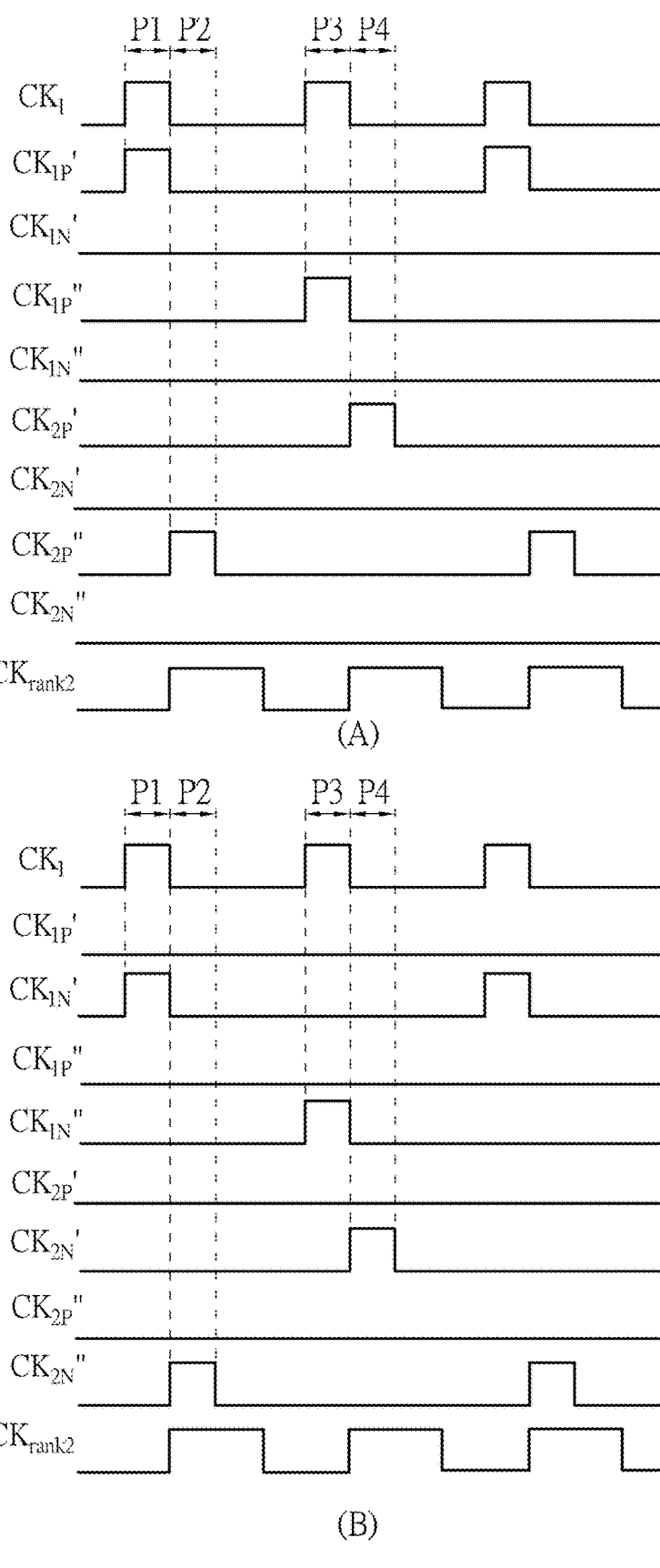
FIG. 4 is a diagram illustrating waveforms of clock signals used for controlling switches of the sampling system shown in FIG. 3 according to an embodiment of the present invention.

As mentioned above, the settling error cancellation operation can be divided into four phases P1, P2, P3, P4. Specifically, the phases P1, P2, P3, P4 are enabled sequentially and cyclically, resulting in a sequence of . . . →P1→P2→P3→P4→P1→P2→P3→P4→ . . . . FIG. 4 is a diagram illustrating waveforms of clock signals used for controlling switches of the sampling system 300 according to an embodiment of the present invention, where the clock signal $CK_{rank2}$ shown in FIG. 4 is used for controlling the ADC.

In a case where the settling error to be cancelled has negative polarity, the clock signals with waveforms shown in sub-diagram (A) of FIG. 4 are used by the sampling system 300. During the first phase P1 of the settling error cancellation operation, the switches $SW_{SE}$, $SW_{11}$ are switched on, and the switches $SW_{12}$-$SW_{14}$, $SW_{21}$-$SW_{24}$ are switched off. During the second phase P2 of the settling error cancellation operation, the switch $SW_{22}$ is switched on, and the switches $SW_{SE}$, $SW_{11}$-$SW_{14}$, $SW_{21}$, $SW_{23}$, $SW_{24}$ are switched off. During the third phase P3 of the settling error cancellation operation, the switches $SW_{SE}$, $SW_{21}$ are switched on, and the switches $SW_{22}$-$SW_{24}$, $SW_{11}$-$SW_{14}$ are switched off. During the fourth phase P4 of the settling error cancellation operation, the switch $SW_{12}$ is switched on, and the switches $SW_{SE}$, $SW_{21}$-$SW_{24}$, $SW_{11}$, $SW_{13}$, $SW_{14}$ are switched off.

In another case where the settling error to be cancelled has positive polarity, the clock signals with waveforms shown in sub-diagram (B) of FIG. 4 are used by the sampling system 300. During the first phase P1 of the settling error cancellation operation, the switches $SW_{SE}$, $SW_{13}$ are switched on, and the switches $SW_{11}$, $SW_{12}$, $SW_{14}$, $SW_{21}$-$SW_{24}$ are switched off. During the second phase P2 of the settling error cancellation operation, the switch $SW_{24}$ is switched on, and the switches $SW_{SE}$, $SW_{11}$-$SW_{14}$, $SW_{21}$-$SW_{23}$ are switched off. During the third phase P3 of the settling error cancellation operation, the switches $SW_{SE}$, $SW_{23}$ are switched on, and the switches $SW_{21}$, $SW_{22}$, $SW_{24}$, $SW_{11}$-$SW_{14}$ are switched off. During the fourth phase P4 of the settling error cancellation operation, the switch $SW_{14}$ is switched on, and the switches $SW_{SE}$, $SW_{21}$-$SW_{24}$, $SW_{11}$-$SW_{13}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{\pm C_{SC}}{C_S + C_{SC}}.$$

The polarity of the settling error cancellation depends on whether an amplifier output (i.e., $-V_I$) of the negative-unity-gain amplifier 308 is used. In a case where the sampler circuit 302 at the main path suffers a settling error $(1-k)$ *$V_O(t0)$ with negative polarity, the partial circuit 304_1 of the first settling error canceller circuit and the partial circuit 306_1 of the second settling error canceller circuit are used during the settling error cancellation operation. In another case where the sampler circuit 302 at the main path suffers a settling error $(1-k)$*$V_O(t0)$ with positive polarity, the partial circuit 304_2 of the first settling error canceller circuit and the partial circuit 306_2 of the second settling error canceller circuit are used during the settling error cancellation operation. In addition, the capacitance value $C_{SC}$ is properly set to ensure that a fraction of the memorized information injected by an active settling error canceller circuit (i.e., one of the first settling error canceller circuit and the second settling error canceller circuit) can cancel the settling error $(1-k)$*$V_O(t0)$. To put it simply, since the polarity and magnitude of the settling error $(1-k)$*$V_O(t0)$ of the sampler circuit 302 can be estimated through an online training process, the magnitude of cancellation weighting $$\frac{C_{SC}}{C_S + C_{SC}}$$

can be properly set by tuning the capacitance value $C_{SC}$ according to the magnitude of the settling error $(1-k)$*$V_O$ (t0) to be cancelled.

Figure 5:
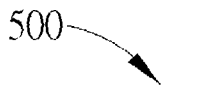
FIG. 5 is a diagram illustrating a third sampling system with settling error cancellation according to an embodiment of the present invention.
Figure 5:
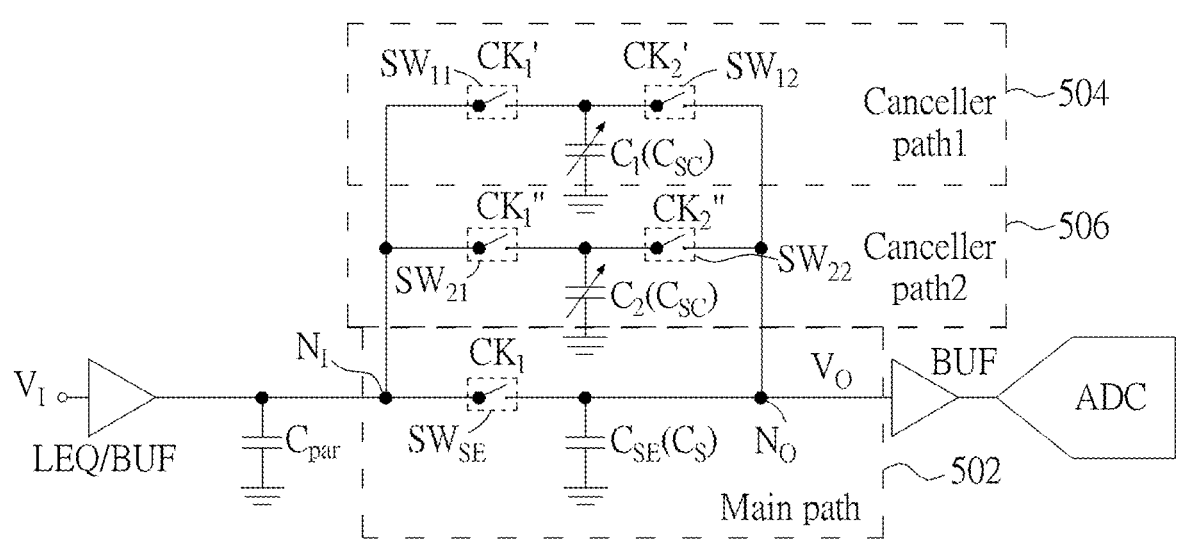

FIG. 5 is a diagram illustrating a third sampling system with settling error cancellation according to an embodiment of the present invention. The sampling system 500 includes a sampler circuit 502 located at a main path, a first settling error canceller circuit 504 located at a first canceller path (labeled by "canceller path1"), and a second settling error canceller circuit 506 located at a second canceller path (labeled by "canceller path2"). Each of the sampler circuit 502, the first settling error canceller circuit 504, and the second settling error canceller circuit 506 is coupled between an input port and an output port of the sampling system 500. In this embodiment, the sampling system 500 is a single-ended operation network. Hence, the input port is a single-ended input port having a single input node $N_I$, the output port is a single-ended output port having a single output node $N_O$, a voltage input derived from the input port is a single-ended voltage input having a single voltage signal $V_I$ (which is driven by one LEQ/BUF), and a voltage output generated from the output port is a single-ended voltage output having a single voltage signal $V_O$ (which is provided to one ADC via one BUF). The difference between the sampling systems 300 and 500 is that the negative-unity-gain amplifier 308 used by the sampling system 300 is omitted in the sampling system 500. Hence, the first settling error canceller circuit 504 and the second settling error canceller circuit 506 can only support cancellation of a settling error with negative polarity.

The sampler circuit 502 includes a sampling capacitor $C_{SE}$ and a switch (e.g., transistor switch) $SW_{SE}$. The sampling capacitor $C_{SE}$ has a first end (top plate) and a second end (bottom plate), where the second end is coupled to a reference voltage (e.g., ground voltage GND). The sampling capacitor $C_{SE}$ has a capacitance value $C_S$. The switch $SW_{SE}$ is controlled by a clock signal $CK_1$, and coupled between the first end of the sampling capacitor $C_{SE}$ and the input node $N_I$.

The first settling error canceller circuit 504 includes a sampling capacitor (e.g., variable capacitor) $C_1$ and a plurality of switches (e.g., transistor switches) $SW_{11}$, $SW_{12}$, where the sampling capacitor $C_1$ has a capacitance value $C_{SC}$. The sampling capacitor $C_1$ has a first end (top plate) and a second end (bottom plate), wherein the second end is coupled to the reference voltage (e.g., ground voltage GND). The switch $SW_{11}$ is controlled by a clock signal $CK_1'$, and coupled between the first end of the sampling capacitor $C_1$ and the input node $N_I$. The switch $SW_{12}$ is controlled by a clock signal $CK_2'$, and coupled between the first end of the sampling capacitor $C_1$ and the output node $N_O$.

The second settling error canceller circuit 506 includes a sampling capacitor (e.g., variable capacitor) $C_2$ and a plurality of switches (e.g., transistor switches) $SW_{21}$, $SW_{22}$, where the sampling capacitor $C_2$ has the capacitance value $C_{SC}$. The sampling capacitor $C_2$ has a first end (top plate) and a second end (bottom plate), wherein the second end is coupled to the reference voltage (e.g., ground voltage GND). The switch $SW_{21}$ is controlled by a clock signal $CK_1''$, and coupled between the first end of the sampling capacitor $C_2$ and the input node $N_I$. The switch $SW_{22}$ is controlled by a clock signal $CK_2''$, and coupled between the first end of the sampling capacitor $C_2$ and the output node $N_O$.

As mentioned above, the settling error cancellation operation can be divided into four phases P1, P2, P3, P4. Specifically, the phases P1, P2, P3, P4 are enabled sequentially and cyclically, resulting in a sequence of . . . $\rightarrow$P1$\rightarrow$P2$\rightarrow$P3$\rightarrow$P4$\rightarrow$P1$\rightarrow$P2$\rightarrow$P3$\rightarrow$P4$\rightarrow$ . . . . Clock signals with waveforms shown in FIG. 2 can be used by the sampling system 500. During the first phase P1 of the settling error cancellation operation, the switches $SW_{SE}$, $SW_{11}$ are switched on, and the switches $SW_{12}$, $SW_{21}$, $SW_{22}$ are switched off. During the second phase P2 of the settling error cancellation operation, the switch $SW_{22}$ is switched on, and the switches $SW_{SE}$, $SW_{11}$, $SW_{12}$, $SW_{21}$ are switched off. During the third phase P3 of the settling error cancellation operation, the switches $SW_{SE}$, $SW_{21}$ are switched on, and the switches $SW_{11}$, $SW_{12}$, $SW_{22}$ are switched off. During the fourth phase P4 of the settling error cancellation operation, the switch $SW_{12}$ is switched on, and the switches $SW_{SE}$, $SW_{11}$, $SW_{21}$, $SW_{22}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{+C_{SC}}{C_S + C_{SC}}.$$

In addition, the capacitance value $C_{SC}$ is properly set to ensure that a fraction of the memorized information injected by an active settling error canceller circuit (i.e., one of the first settling error canceller circuit and the second settling error canceller circuit) can cancel the settling error $(1-k)$ $*V_O(t0)$. To put it simply, the magnitude of cancellation weighting $$\frac{+C_{SC}}{C_S + C_{SC}}$$

can be properly set by tuning the capacitance value $C_{SC}$ according to the magnitude of the settling error $(1-k)*V_O$ (t0) to be cancelled.

Figure 6:
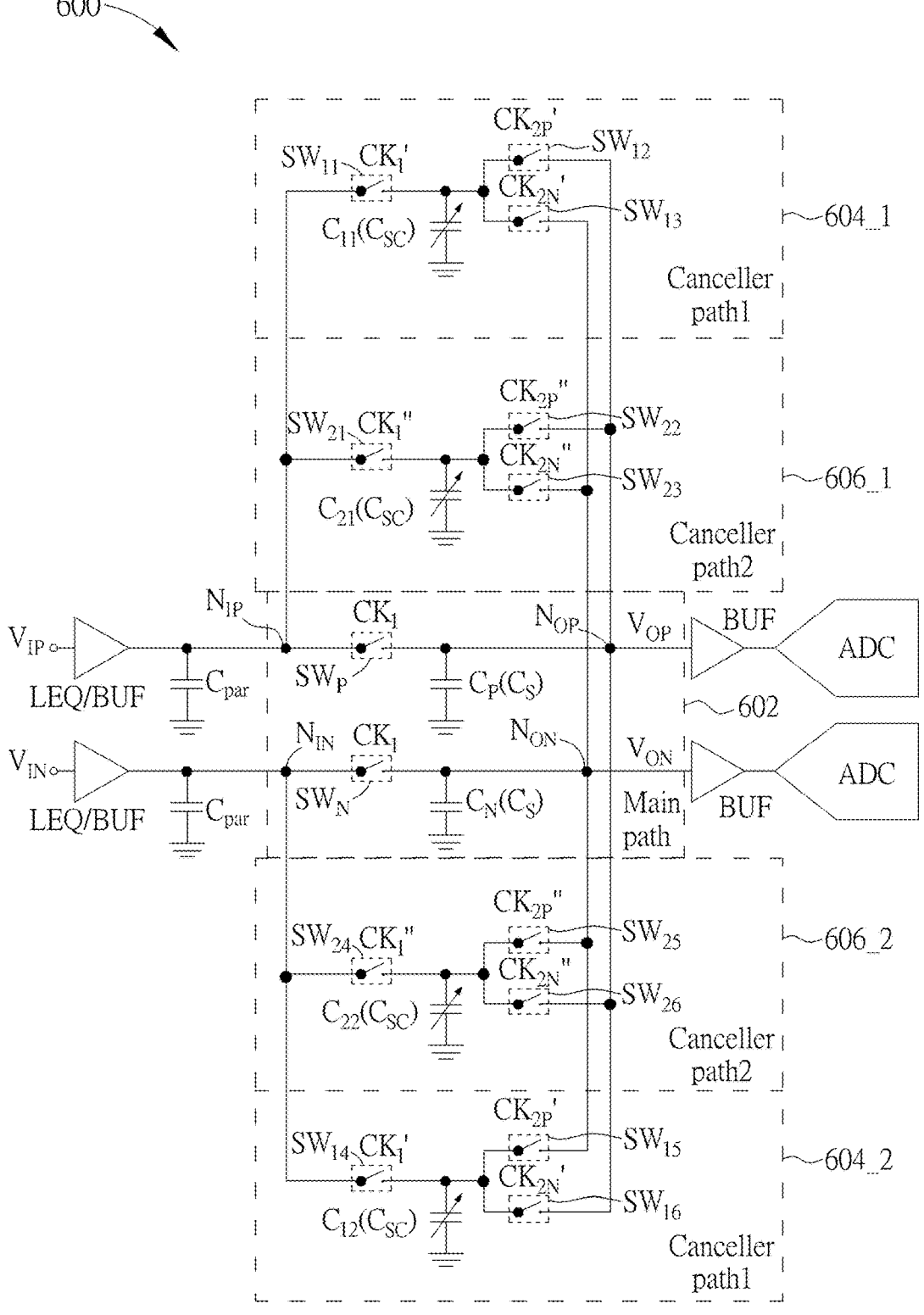
FIG. 6 is a diagram illustrating a fourth sampling system with settling error cancellation according to an embodiment of the present invention.

FIG. 6 is a diagram illustrating a fourth sampling system with settling error cancellation according to an embodiment of the present invention. The sampling system 600 includes a sampler circuit 602 located at a main path, a first settling error canceller circuit (which includes a plurality of partial circuits 604_1 and 604_2) located at a first canceller path (labeled by "canceller path1"), and a second settling error canceller circuit (which includes a plurality of partial circuits 606_1 and 606_2) located at a second canceller path (labeled by "canceller path2"). Each of the sampler circuit 602, the first settling error canceller circuit, and the second settling error canceller circuit is coupled between an input port and an output port of the sampling system 600. In this embodiment, the sampling system 600 is a differential operation network. Hence, the input port is a differential input port having a positive input node $N_{IP}$ and a negative input node $N_{IN}$, the output port is a differential output port having a positive output node $N_{OP}$ and a negative output node $N_{ON}$, a voltage input derived from the input port is a differential voltage input having a positive voltage signal $V_{IP}$ (which is driven by one LEQ/BUF) and a negative voltage signal $V_{IN}$ (which is driven by another LEQ/BUF), and a voltage output generated from the output port is a differential voltage output having a positive voltage signal $V_{OP}$ (which is provided to one ADC via one BUF) and a negative voltage signal $V_{ON}$ (which is provided to another ADC via another BUF).

The sampler circuit 602 includes a plurality of sampling capacitors $C_P$ and $C_N$ and a plurality of switches (e.g., transistor switches) $SW_P$ and $SW_N$. The sampling capacitor $C_P$ has a first end (top plate) and a second end (bottom plate), where the second end is coupled to a reference voltage (e.g., ground voltage GND). The sampling capacitor $C_N$ has a first end (top plate) and a second end (bottom plate), where the second end is coupled to the reference voltage (e.g., ground voltage GND). The sampling capacitors $C_P$ and $C_N$ have the same capacitance value $C_S$. The switch $SW_P$ is controlled by a clock signal $CK_1$, and coupled between the first end of the sampling capacitor $C_P$ and the positive input node $N_{IP}$. The switch $SW_N$ is controlled by the clock signal $CK_1$, and coupled between the first end of the sampling capacitor $C_N$ and the negative input node $N_{IN}$.

The first settling error canceller circuit includes a plurality of sampling capacitors (e.g., variable capacitors) $C_{11}$, $C_{12}$ and a plurality of switches (e.g., transistor switches) $SW_{11}$, $SW_{12}$, $SW_{13}$, $SW_{14}$, $SW_{15}$, $SW_{16}$, where the sampling capacitors $C_{11}$ and $C_{12}$ have the same capacitance value $C_{SC}$. The sampling capacitor $C_{11}$ has a first end (top plate) and a second end (bottom plate), wherein the second end is coupled to the reference voltage (e.g., ground voltage GND). The sampling capacitor $C_{12}$ has a first end (top plate) and a second end (bottom plate), wherein the second end is coupled to the reference voltage (e.g., ground voltage GND). Compared to the first settling error canceller circuit used in the sampling system 100, the first settling error canceller circuit used in the sampling system 600 requires fewer sampling capacitors.

The switch $SW_{11}$ is controlled by a clock signal $CK_1'$, and coupled between the first end of the sampling capacitor $C_{11}$ and the positive input node $N_{IP}$. The switch $SW_{12}$ is controlled by a clock signal $CK_{2P}'$, and coupled between the first end of the sampling capacitor $C_{11}$ and the positive output node $N_{OP}$. The switch $SW_{13}$ is controlled by the clock signal $CK_{2N}'$, and coupled between the first end of the sampling capacitor $C_{11}$ and the negative input node $N_{ON}$. The switch $SW_{14}$ is controlled by the clock signal $CK_1'$, and coupled between the first end of the sampling capacitor $C_{12}$ and the negative input node $N_{IN}$. The switch $SW_{15}$ is controlled by the clock signal $CK_{2P}'$, and coupled between the first end of the sampling capacitor $C_{12}$ and the negative output node $N_{ON}$. The switch $SW_{16}$ is controlled by the clock signal $CK_{2N}'$, and coupled between the first end of the sampling capacitor Cie and the positive output node $N_{OP}$.

The second settling error canceller circuit includes a plurality of sampling capacitors (e.g., variable capacitors) $C_{21}$, $C_{22}$ and a plurality of switches (e.g., transistor switches) $SW_{21}$, $SW_{22}$, $SW_{23}$, $SW_{24}$, $SW_{25}$, $SW_{26}$, where the sampling capacitors $C_{21}$ and $C_{22}$ have the same capacitance value $C_{SC}$. The sampling capacitor $C_{21}$ has a first end (top plate) and a second end (bottom plate), wherein the second end is coupled to the reference voltage (e.g., ground voltage GND). The sampling capacitor $C_{22}$ has a first end (top plate) and a second end (bottom plate), wherein the second end is coupled to the reference voltage (e.g., ground voltage GND). Compared to the second settling error canceller circuit used in the sampling system 100, the second settling error canceller circuit used in the sampling system 600 requires fewer sampling capacitors.

The switch $SW_{21}$ is controlled by a clock signal $CK_1''$, and coupled between the first end of the sampling capacitor $C_{21}$ and the positive input node $N_{IP}$. The switch $SW_{22}$ is controlled by a clock signal $CK_{2P}''$, and coupled between the first end of the sampling capacitor $C_{21}$ and the positive output node $N_{OP}$. The switch $SW_{23}$ is controlled by the clock signal $CK_{2N}''$, and coupled between the first end of the sampling capacitor $C_{21}$ and the negative input node $N_{ON}$. The switch $SW_{24}$ is controlled by the clock signal $CK_1''$, and coupled between the first end of the sampling capacitor $C_{22}$ and the negative input node $N_{IN}$. The switch $SW_{25}$ is controlled by the clock signal $CK_{2P}''$, and coupled between the first end of the sampling capacitor $C_{22}$ and the negative output node $N_{ON}$. The switch $SW_{26}$ is controlled by the clock signal $CK_{2N}''$, and coupled between the first end of the sampling capacitor $C_{22}$ and the positive output node $N_{OP}$.

Figure 7:
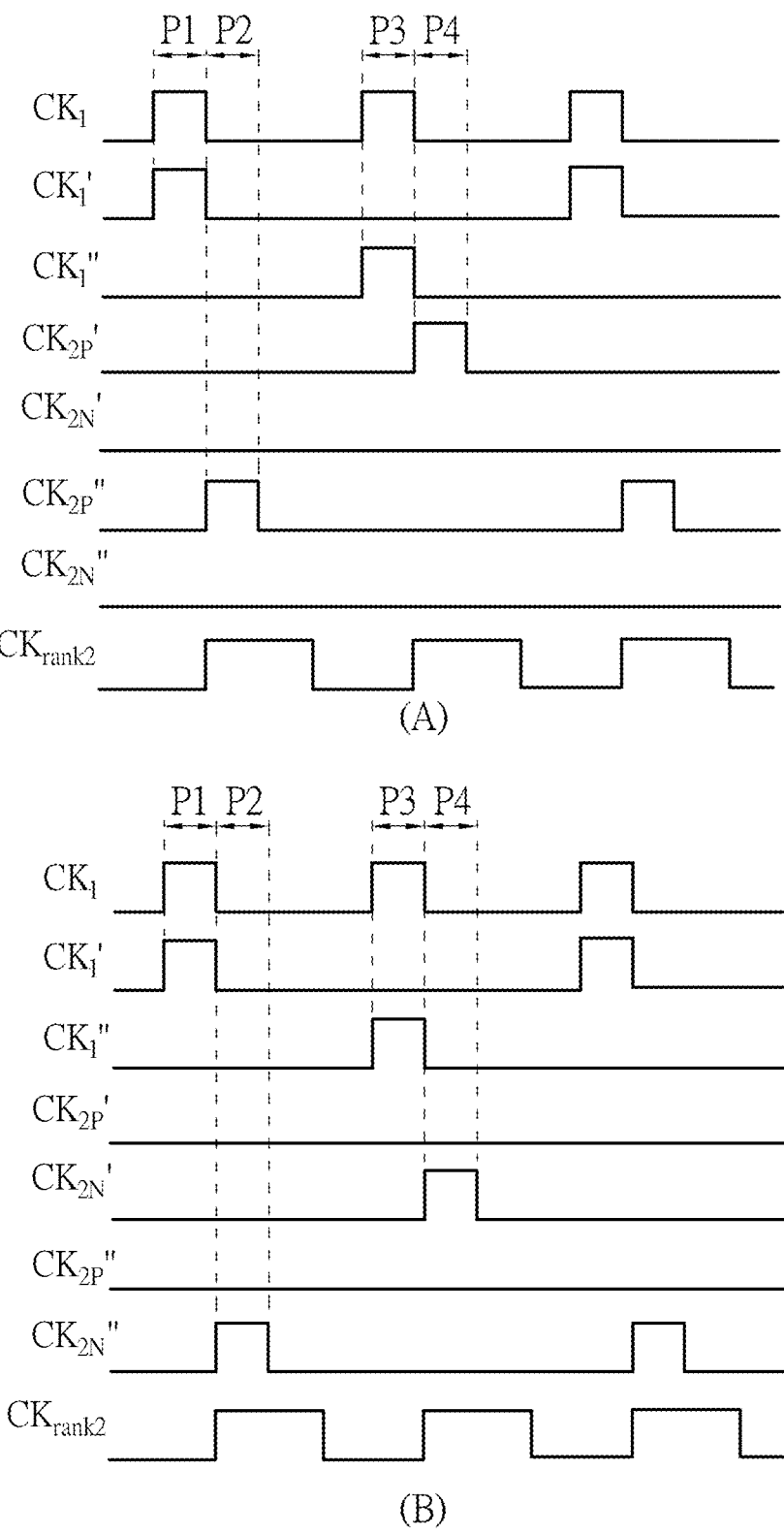
FIG. 7 is a diagram illustrating waveforms of clock signals used for controlling switches of the sampling system shown in FIG. 6 according to an embodiment of the present invention.

As mentioned above, the settling error cancellation operation can be divided into four phases P1, P2, P3, P4. Specifically, the phases P1, P2, P3, P4 are enabled sequentially and cyclically, resulting in a sequence of . . . →P1→P2→P3→P4→P1→P2→P3→P4→ . . . . FIG. 7 is a diagram illustrating waveforms of clock signals used for controlling switches of the sampling system 600 according to an embodiment of the present invention, where the clock signal $CK_{rank2}$ shown in FIG. 7 is used for controlling the ADC.

In a case where the settling error to be cancelled has negative polarity, the clock signals with waveforms shown in sub-diagram (A) of FIG. 7 are used by the sampling system 600. During the first phase P1 of the settling error cancellation operation, the switches $SW_P$, $SW_N$, $SW_{11}$, $SW_{14}$ are switched on, and the switches $SW_{12}$, $SW_{13}$, $SW_{15}$, $SW_{16}$, $SW_{21}$-$SW_{26}$ are switched off. During the second phase P2 of the settling error cancellation operation, the switches $SW_{22}$, $SW_{25}$ are switched on, and the switches $SW_P$, $SW_N$, $SW_{11}$-$SW_{16}$, $SW_{21}$, $SW_{23}$, $SW_{24}$, $SW_{26}$ are switched off. During the third phase P3 of the settling error cancellation operation, the switches $SW_P$, $SW_N$, $SW_{21}$, $SW_{24}$ are switched on, and the switches $SW_{22}$, $SW_{23}$, $SW_{25}$, $SW_{26}$, $SW_{11}$-$SW_{16}$ are switched off. During the fourth phase P4 of the settling error cancellation operation, the switches $SW_{12}$, $SW_{15}$ are switched on, and the switches $SW_P$, $SW_N$, $SW_{11}$, $SW_{13}$, $SW_{14}$, $SW_{16}$, $SW_{21}$-$SW_{26}$ are switched off.

In another case where the settling error to be cancelled has positive polarity, the clock signals with waveforms shown in sub-diagram (B) of FIG. 7 are used by the sampling system 600. During the first phase P1 of the settling error cancellation operation, the switches $SW_P$, $SW_N$, $SW_{11}$, $SW_{14}$ are switched on, and the switches $SW_{12}$, $SW_{13}$, $SW_{15}$, $SW_{16}$, $SW_{21}$-$SW_{26}$ are switched off. During the second phase P2 of the settling error cancellation operation, the switches $SW_{23}$, $SW_{26}$ are switched on, and the switches $SW_P$, $SW_N$, $SW_{11}$-$SW_{16}$, $SW_{21}$, $SW_{22}$, $SW_{24}$, $SW_{25}$ are switched off. During the third phase P3 of the settling error cancellation operation, the switches $SW_P$, $SW_N$, $SW_{21}$, $SW_{24}$ are switched on, and the switches $SW_{22}$, $SW_{23}$, $SW_{25}$, $SW_{26}$, $SW_{11}$-$SW_{16}$ are switched off. During the fourth phase P4 of the settling error cancellation operation, the switches $SW_{13}$, $SW_{16}$ are switched on, and the switches $SW_P$, $SW_N$, $SW_{11}$, $SW_{12}$, $SW_{14}$, $SW_{15}$, $SW_{21}$-$SW_{26}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{\pm C_{SC}}{C_S + C_{SC}}.$$

The polarity of the settling error cancellation depends on the switch selection. In a case where the sampler circuit 602 at the main path suffers a settling error $(1-k)*V_O(t0)$ with negative polarity, the switches $(SW_{12}, SW_{15})$ and $(SW_{22}, SW_{25})$ are selected for settling error cancellation. In another case where the sampler circuit 602 at the main path suffers a settling error $(1-k)*V_O(t0)$ with positive polarity, the switches $(SW_{13}, SW_{16})$ and $(SW_{23}, SW_{26})$ are selected for settling error cancellation. In addition, the capacitance value $C_{SC}$ is properly set to ensure that a fraction of the memorized information injected by an active settling error canceller circuit (i.e., one of the first settling error canceller circuit and the second settling error canceller circuit) can cancel the settling error $(1-k)*V_O(t0)$. To put it simply, since the polarity and magnitude of the settling error $(1-k)*V_O(t0)$ of the sampler circuit 602 can be estimated through an online training process, the magnitude of cancellation weighting $$\frac{C_{SC}}{C_S + C_{SC}}$$

can be properly set by tuning the capacitance value $C_{SC}$ according to the magnitude of the settling error $(1-k)*V_O$ (t0) to be cancelled.

Figure 8:
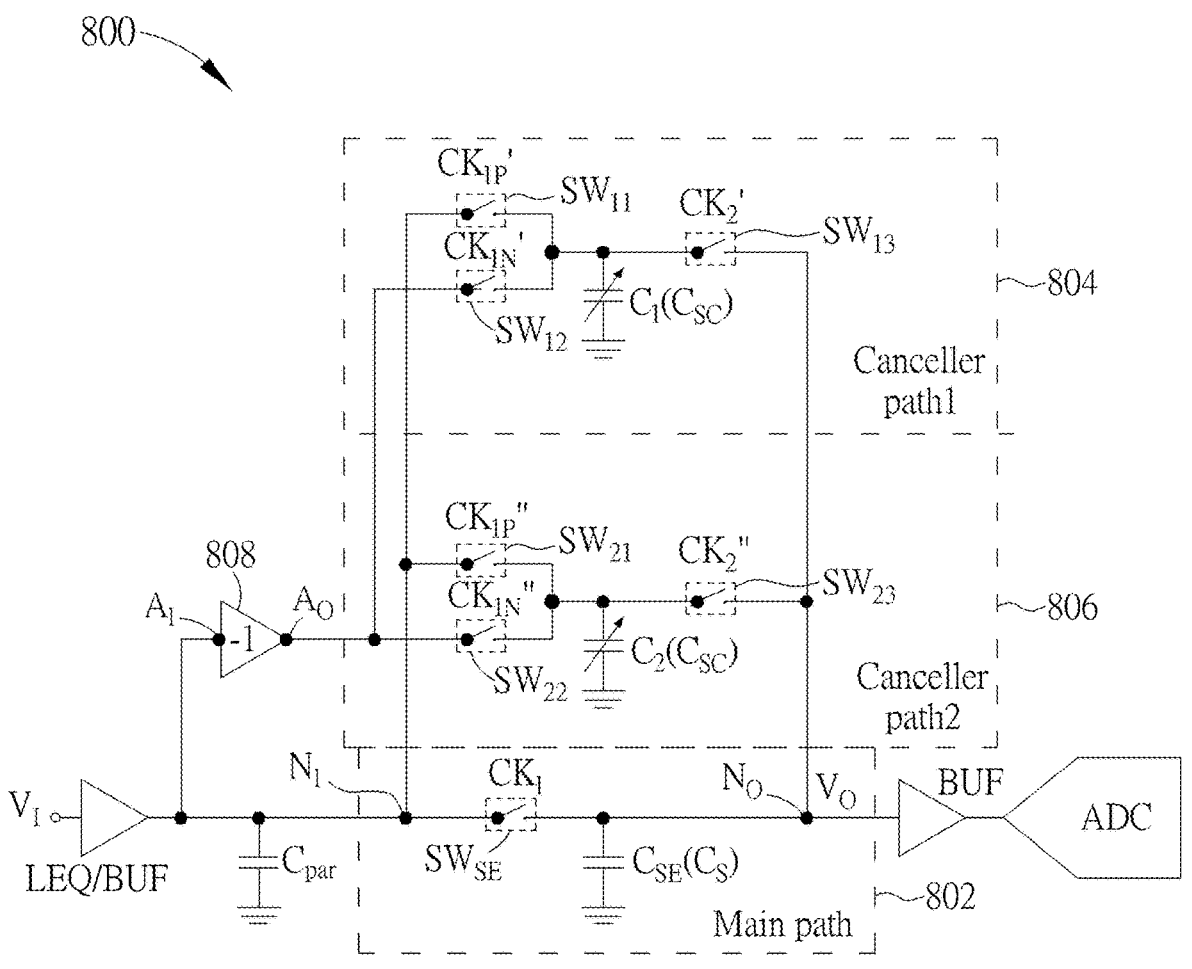
FIG. 8 is a diagram illustrating a fifth sampling system with settling error cancellation according to an embodiment of the present invention.

FIG. 8 is a diagram illustrating a fifth sampling system with settling error cancellation according to an embodiment of the present invention. The sampling system 800 includes a sampler circuit 802 located at a main path, a first settling error canceller circuit 804 located at a first canceller path (labeled by "canceller path1"), a second settling error canceller circuit 806 located at a second canceller path (labeled by "canceller path2"), and a negative-unity-gain amplifier 808. Each of the sampler circuit 802, the first settling error canceller circuit 804, and the second settling error canceller circuit 806 is coupled between an input port and an output port of the sampling system 800. In this embodiment, the sampling system 800 is a single-ended operation network. Hence, the input port is a single-ended input port having a single input node $N_I$, the output port is a single-ended output port having a single output node $N_O$, a voltage input derived from the input port is a single-ended voltage input having a single voltage signal $V_I$ (which is driven by one LEQ/BUF), and a voltage output generated from the output port is a single-ended voltage output having a single voltage signal $V_O$ (which is provided to one ADC via one BUF).

The negative-unity-gain amplifier 808 has an amplifier input node $A_I$ and an amplifier output node $A_O$, wherein the amplifier input node $A_I$ is coupled to the input node $N_I$. The sampler circuit 802 includes a sampling capacitor $C_{SE}$ and a switch (e.g., transistor switch) $SW_{SE}$. The sampling capacitor $C_{SE}$ has a first end (top plate) and a second end (bottom plate), where the second end is coupled to a reference voltage (e.g., ground voltage GND). The sampling capacitor $C_{SE}$ has a capacitance value $C_S$. The switch $SW_{SE}$ is controlled by a clock signal $CK_1$, and coupled between the first end of the sampling capacitor $C_{SE}$ and the input node $N_I$.

The first settling error canceller circuit 804 includes a sampling capacitor (e.g., variable capacitor) $C_1$ and a plurality of switches (e.g., transistor switches) $SW_{11}$, $SW_{12}$, $SW_{13}$, where the sampling capacitor $C_1$ has a capacitance value $C_{SC}$. The sampling capacitor $C_1$ has a first end (top plate) and a second end (bottom plate), wherein the second end is coupled to the reference voltage (e.g., ground voltage GND). The switch $SW_{11}$ is controlled by a clock signal $CK_{1P}'$, and coupled between the first end of the sampling capacitor $C_1$ and the input node $N_I$. The switch $SW_{12}$ is controlled by a clock signal $CK_{1N}'$, and coupled between the first end of the sampling capacitor $C_1$ and the amplifier output node $A_O$. The switch $SW_{13}$ is controlled by the clock signal $CK_2'$, and coupled between the first end of the sampling capacitor $C_1$ and the output node $N_O$.

The second settling error canceller circuit 806 includes a sampling capacitor (e.g., variable capacitor) $C_2$ and a plurality of switches (e.g., transistor switches) $SW_{21}$, $SW_{22}$, $SW_{23}$, where the sampling capacitor $C_2$ has the capacitance value $C_{SC}$. The sampling capacitor $C_2$ has a first end (top plate) and a second end (bottom plate), wherein the second end is coupled to the reference voltage (e.g., ground voltage GND). The switch $SW_{21}$ is controlled by a clock signal $CK_{1P}''$, and coupled between the first end of the sampling capacitor $C_2$ and the input node $N_I$. The switch $SW_{22}$ is controlled by a clock signal $CK_{1N}''$, and coupled between the first end of the sampling capacitor $C_2$ and the amplifier output node $A_O$. The switch $SW_{23}$ is controlled by the clock signal $CK_2''$, and coupled between the first end of the sampling capacitor $C_2$ and the output node $N_O$.

Figure 9:
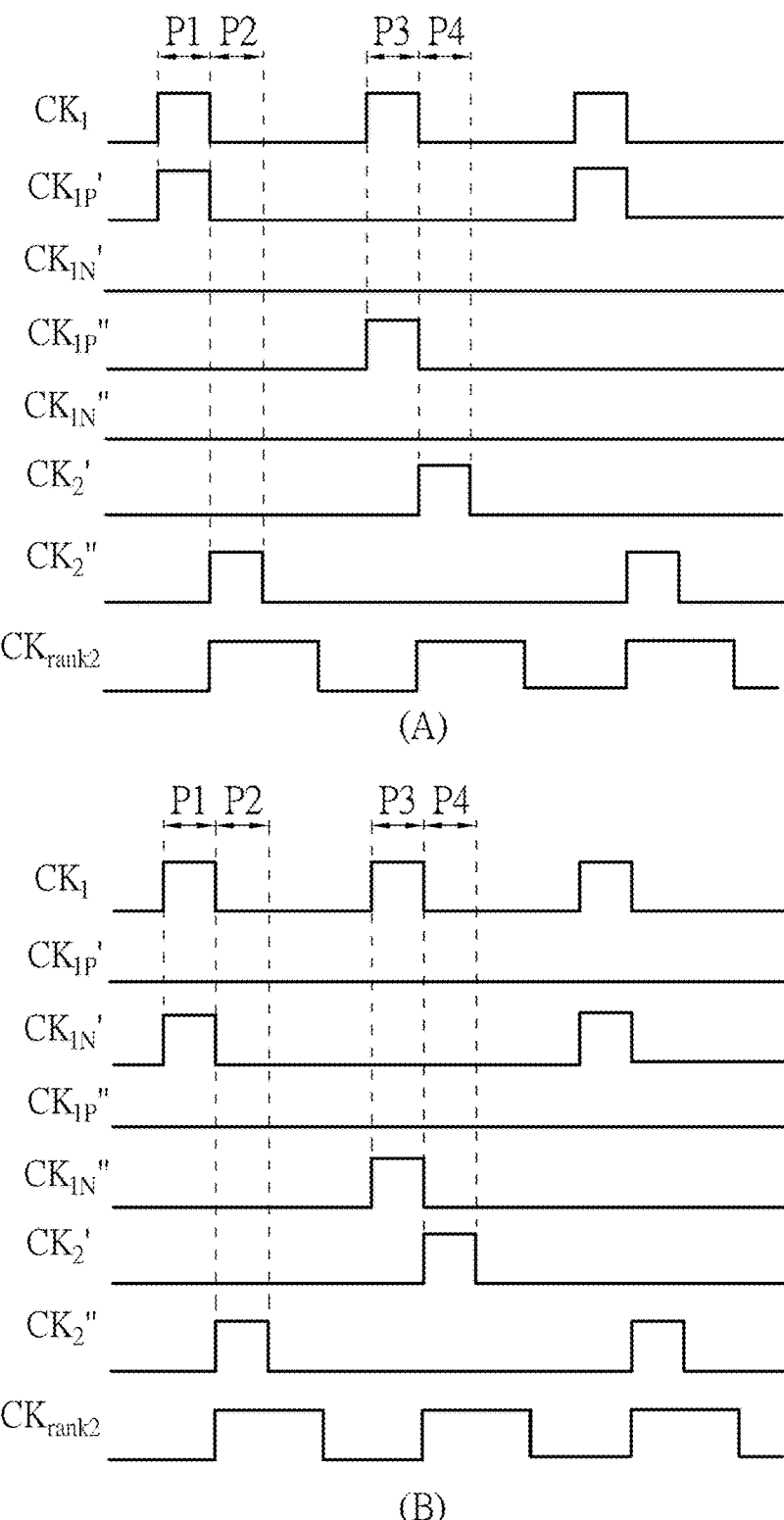
FIG. 9 is a diagram illustrating waveforms of clock signals used for controlling switches of the sampling system shown in FIG. 8 according to an embodiment of the present invention.

As mentioned above, the settling error cancellation operation can be divided into four phases P1, P2, P3, P4. Specifically, the phases P1, P2, P3, P4 are enabled sequentially and cyclically, resulting in a sequence of . . . →P1→P2→P3→P4→P1→P2→P3→P4→ . . . . FIG. 9 is a diagram illustrating waveforms of clock signals used for controlling switches of the sampling system 800 according to an embodiment of the present invention, where the clock signal $CK_{rank2}$ shown in FIG. 9 is used for controlling the ADC.

In a case where the settling error to be cancelled has negative polarity, the clock signals with waveforms shown in sub-diagram (A) of FIG. 9 are used by the sampling system 800. During the first phase P1 of the settling error cancellation operation, the switches $SW_{SE}$, $SW_{11}$ are switched on, and the switches $SW_{12}$, $SW_{13}$, $SW_{21}$-$SW_{23}$ are switched off. During the second phase P2 of the settling error cancellation operation, the switch $SW_{23}$ is switched on, and the switches $SW_{SE}$, $SW_{11}$-$SW_{13}$, $SW_{21}$, $SW_{22}$ are switched off. During the third phase P3 of the settling error cancellation operation, the switches $SW_{SE}$, $SW_{21}$ are switched on, and the switches $SW_{11}$-$SW_{13}$, $SW_{22}$, $SW_{23}$ are switched off. During the fourth phase P4 of the settling error cancellation operation, the switch $SW_{13}$ is switched on, and the switches $SW_{SE}$, $SW_{21}$-$SW_{23}$, $SW_{11}$, $SW_{12}$ are switched off.

In another case where the settling error to be cancelled has positive polarity, the clock signals with waveforms shown in sub-diagram (B) of FIG. 9 are used by the sampling system 800. During the first phase P1 of the settling error cancellation operation, the switches $SW_{SE}$, $SW_{12}$ are switched on, and the switches $SW_{11}$, $SW_{13}$, $SW_{21}$-$SW_{23}$ are switched off. During the second phase P2 of the settling error cancellation operation, the switch $SW_{23}$ is switched on, and the switches $SW_{SE}$, $SW_{11}$-$SW_{13}$, $SW_{21}$, $SW_{22}$ are switched off. During the third phase P3 of the settling error cancellation operation, the switches $SW_{SE}$, $SW_{22}$ are switched on, and the switches $SW_{21}$, $SW_{23}$, $SW_{11}$-$SW_{13}$ are switched off. During the fourth phase P4 of the settling error cancellation operation, the switch $SW_{13}$ is switched on, and the switches $SW_{SE}$, $SW_{11}$, $SW_{12}$, $SW_{21}$-$SW_{23}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{\pm C_{SC}}{C_S + C_{SC}}.$$

The polarity of the settling error cancellation depends on whether an amplifier output (i.e., $-V_I$) of the negative-unity-gain amplifier 808 is used. In a case where the sampler circuit 802 at the main path suffers a settling error $(1-k)$ $*V_O(t0)$ with negative polarity, the switches $SW_{11}$, $SW_{21}$ are used during the sampling phases. In another case where the sampler circuit 802 at the main path suffers a settling error $(1-k)*V_O(t0)$ with positive polarity, the switches $SW_{12}$, $SW_{22}$ are used during the sampling phases. In addition, the capacitance value $C_{SC}$ is properly set to ensure that a fraction of the memorized information injected by an active settling error canceller circuit (i.e., one of the first settling error canceller circuit and the second settling error canceller circuit) can cancel the settling error $(1-k)*V_O(t0)$. To put it simply, since the polarity and magnitude of the settling error $(1-k)*V_O(t0)$ of the sampler circuit 802 can be estimated through an online training process, the magnitude of cancellation weighting $$\frac{C_{SC}}{C_S + C_{SC}}$$

can be properly set by tuning the capacitance value $C_{SC}$ according to the magnitude of the settling error $(1-k)*V_O$ $(t0)$ to be cancelled.

Figure 10:
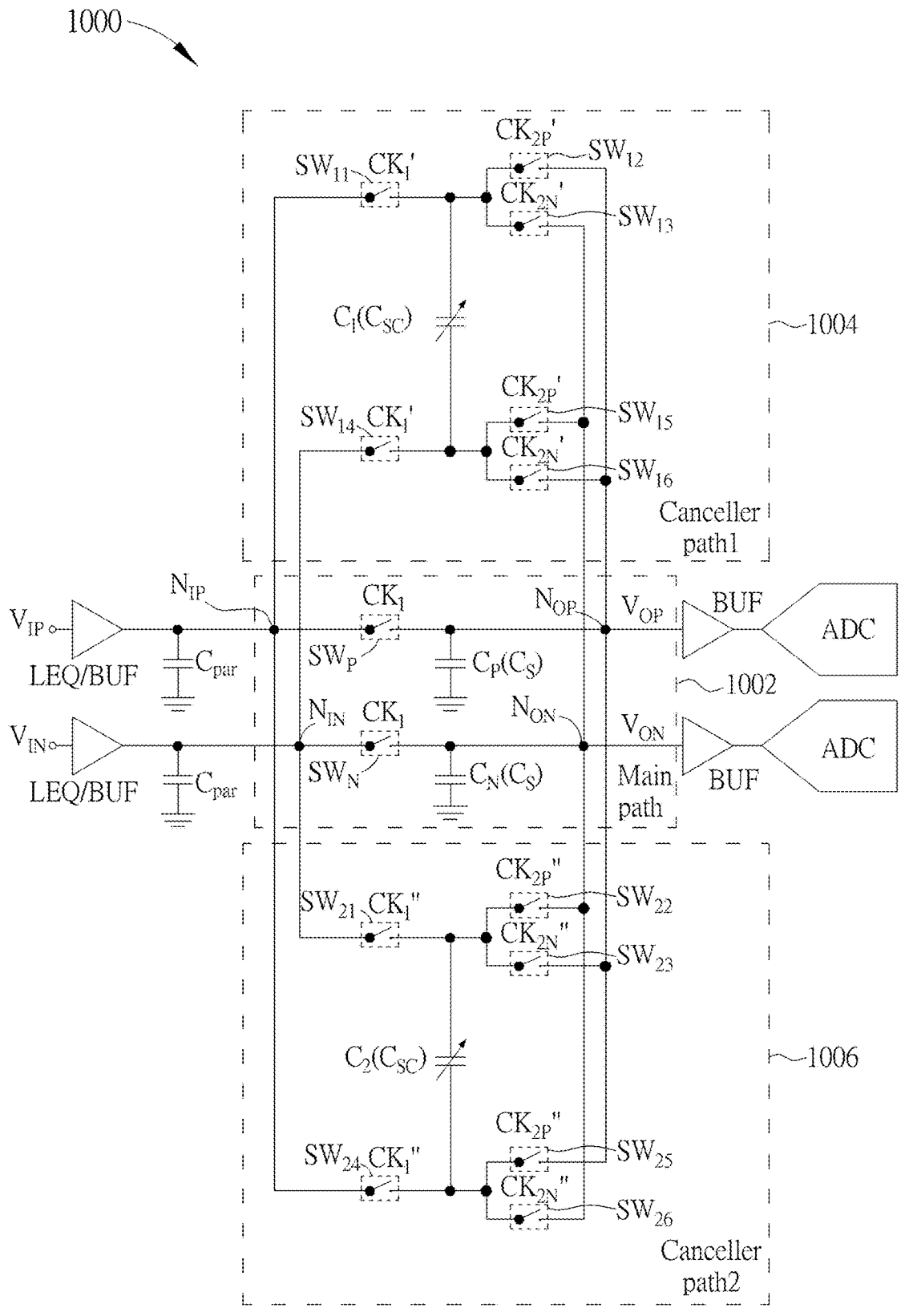
FIG. 10 is a diagram illustrating a sixth sampling system with settling error cancellation according to an embodiment of the present invention.

FIG. 10 is a diagram illustrating a sixth sampling system with settling error cancellation according to an embodiment of the present invention. The sampling system 1000 includes a sampler circuit 1002 located at a main path, a first settling error canceller circuit 1004 located at a first canceller path (labeled by "canceller path1"), and a second settling error canceller circuit 1006 located at a second canceller path (labeled by "canceller path2"). Each of the sampler circuit 1002, the first settling error canceller circuit 1004, and the second settling error canceller circuit 1006 is coupled between an input port and an output port of the sampling system 1000. In this embodiment, the sampling system 1000 is a differential operation network. Hence, the input port is a differential input port having a positive input node $N_{IP}$ and a negative input node $N_{IN}$, the output port is a differential output port having a positive output node $N_{OP}$ and a negative output node $N_{ON}$, a voltage input derived from the input port is a differential voltage input having a positive voltage signal $V_{IP}$ (which is driven by one LEQ/BUF) and a negative voltage signal $V_{IN}$ (which is driven by another LEQ/BUF), and a voltage output generated from the output port is a differential voltage output having a positive voltage signal $V_{OP}$ (which is provided to one ADC via one BUF) and a negative voltage signal $V_{ON}$ (which is provided to another ADC via another BUF).

The sampler circuit 1002 includes a plurality of sampling capacitors $C_P$ and $C_N$ and a plurality of switches (e.g., transistor switches) $SW_P$ and $SW_N$. The sampling capacitor $C_P$ has a first end (top plate) and a second end (bottom plate), where the second end is coupled to a reference voltage (e.g., ground voltage GND). The sampling capacitor $C_N$ has a first end (top plate) and a second end (bottom plate), where the second end is coupled to the reference voltage (e.g., ground voltage GND). The sampling capacitors $C_P$ and $C_N$ have the same capacitance value $C_S$. The switch $SW_P$ is controlled by a clock signal $CK_1$, and coupled between the first end of the sampling capacitor $C_P$ and the positive input node $N_{IP}$. The switch $SW_N$ is controlled by the clock signal $CK_1$, and coupled between the first end of the sampling capacitor $C_N$ and the negative input node $N_{IN}$.

The first settling error canceller circuit 1004 includes a sampling capacitor (e.g., variable capacitor) $C_1$ and a plurality of switches (e.g., transistor switches) $SW_{11}$, $SW_{12}$, $SW_{13}$, $SW_{14}$, $SW_{15}$, $SW_{16}$. The sampling capacitor $C_1$ has the capacitance value $C_{SC}$, and has a first end (top plate) and a second end (bottom plate). Compared to the first settling error canceller circuit used in the sampling system 600, the first settling error canceller circuit used in the sampling system 1000 requires fewer sampling capacitors.

The switch $SW_{11}$ is controlled by a clock signal $CK_1'$, and coupled between the first end of the sampling capacitor $C_1$ and the positive input node $N_{IP}$. The switch $SW_{12}$ is controlled by a clock signal $CK_{2P}'$, and coupled between the first end of the sampling capacitor $C_1$ and the positive output node $N_{OP}$. The switch $SW_{13}$ is controlled by a clock signal $CK_{2N}'$, and coupled between the first end of the sampling capacitor $C_1$ and the negative input node $N_{ON}$. The switch $SW_{14}$ is controlled by the clock signal $CK_1'$, and coupled between the second end of the sampling capacitor $C_1$ and the negative input node $N_{IN}$. The switch $SW_{15}$ is controlled by a clock signal $CK_{2P}'$, and coupled between the second end of the sampling capacitor $C_1$ and the negative output node $N_{ON}$. The switch $SW_{16}$ is controlled by a clock signal $CK_{2N}'$, and coupled between the second end of the sampling capacitor $C_1$ and the positive output node $N_{OP}$.

The second settling error canceller circuit 1006 includes a sampling capacitor (e.g., variable capacitor) $C_2$ and a plurality of switches (e.g., transistor switches) $SW_{21}$, $SW_{22}$, $SW_{23}$, $SW_{24}$, $SW_{25}$, $SW_{26}$. The sampling capacitor $C_2$ with the capacitance value $C_{SC}$ has a first end (top plate) and a second end (bottom plate). Compared to the second settling error canceller circuit used in the sampling system 600, the second settling error canceller circuit used in the sampling system 1000 requires fewer sampling capacitors.

The switch $SW_{21}$ is controlled by a clock signal $CK_1''$, and coupled between the first end of the sampling capacitor Ce and the negative input node $N_{IN}$. The switch $SW_{22}$ is controlled by a clock signal $CK_{2P}''$, and coupled between the first end of the sampling capacitor $C_2$ and the negative output node $N_{ON}$. The switch $SW_{23}$ is controlled by a clock signal $CK_{2N}''$, and coupled between the first end of the sampling capacitor $C_2$ and the positive output node $N_{OP}$. The switch $SW_{24}$ is controlled by the clock signal $CK_1''$, and coupled between the second end of the sampling capacitor $C_2$ and the positive input node $N_{IP}$. The switch $SW_{25}$ is controlled by the clock signal $CK_{2P}''$, and coupled between the second end of the sampling capacitor $C_2$ and the positive output node $N_{OP}$. The switch $SW_{26}$ is controlled by the clock signal $CK_{2N}''$, and coupled between the second end of the sampling capacitor $C_2$ and the negative output node $N_{ON}$.

As mentioned above, the settling error cancellation operation can be divided into four phases P1, P2, P3, P4. Specifically, the phases P1, P2, P3, P4 are enabled sequentially and cyclically, resulting in a sequence of . . . $\rightarrow$P1$\rightarrow$P2$\rightarrow$P3$\rightarrow$P4$\rightarrow$P1$\rightarrow$P2$\rightarrow$P3$\rightarrow$P4$\rightarrow$ . . . . In a case where the settling error to be cancelled has negative polarity, clock signals with waveforms shown in sub-diagram (A) of FIG. 7 can be used by the sampling system 1000. During the first phase P1 of the settling error cancellation operation, the switches $SW_P$, $SW_N$, $SW_{11}$, $SW_{14}$ are switched on, and the switches $SW_{12}$, $SW_{13}$, $SW_{15}$, $SW_{16}$, $SW_{21}$-$SW_{26}$ are switched off. During the second phase P2 of the settling error cancellation operation, the switches $SW_{22}$, $SW_{25}$ are switched on, and the switches $SW_P$, $SW_N$, $SW_{11}$-$SW_{16}$, $SW_{21}$, $SW_{23}$, $SW_{24}$, $SW_{26}$ are switched off. During the third phase P3 of the settling error cancellation operation, the switches $SW_P$, $SW_N$, $SW_{21}$, $SW_{24}$ are switched on, and the switches $SW_{22}$, $SW_{23}$, $SW_{25}$, $SW_{26}$, $SW_{11}$-$SW_{16}$ are switched off. During the fourth phase P4 of the settling error cancellation operation, the switches $SW_{12}$, $SW_{15}$ are switched on, and the switches $SW_P$, $SW_N$, $SW_{11}$, $SW_{13}$, $SW_{14}$, $SW_{16}$, $SW_{21}$-$SW_{26}$ are switched off.

In another case where the settling error to be cancelled has positive polarity, clock signals with waveforms shown in sub-diagram (B) of FIG. 7 can be used by the sampling system 1000. During the first phase P1 of the settling error cancellation operation, the switches $SW_P$, $SW_N$, $SW_{11}$, $SW_{14}$ are switched on, and the switches $SW_{12}$, $SW_{13}$, $SW_{15}$, $SW_{16}$, $SW_{21}$-$SW_{26}$ are switched off. During the second phase P2 of the settling error cancellation operation, the switches SW 3, $SW_{26}$ are switched on, and the switches $SW_P$, $SW_N$, $SW_{11}$-$SW_{16}$, $SW_{21}$, $SW_{22}$, $SW_{24}$, $SW_{25}$ are switched off. During the third phase P3 of the settling error cancellation operation, the switches $SW_P$, $SW_N$, $SW_{21}$, $SW_{24}$ are switched on, and the switches $SW_{22}$, $SW_{23}$, $SW_{25}$, $SW_{26}$, $SW_{11}$-$SW_{16}$ are switched off. During the fourth phase P4 of the settling error cancellation operation, the switches $SW_{13}$, $SW_{16}$ are switched on, and the switches $SW_P$, $SW_N$, $SW_{11}$, $SW_{12}$, $SW_{14}$, $SW_{15}$, $SW_{21}$-$SW_{26}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{\pm C_{SC}}{C_S + C_{SC}}.$$

The polarity of the settling error cancellation depends on the switch selection. In a case where the sampler circuit 1002 at the main path suffers a settling error $(1-k)*V_O(t0)$ with negative polarity, the switches ($SW_{12}$, $SW_{15}$) and ($SW_{22}$, $SW_{25}$) are selected for settling error cancellation. In another case where the sampler circuit 1002 at the main path suffers a settling error $(1-k)*V_O(t0)$ with positive polarity, the switches ($SW_{13}$, $SW_{16}$) and ($SW_{23}$, $SW_{26}$) are selected for settling error cancellation. In addition, the capacitance value $C_{SC}$ is properly set to ensure that a fraction of the memorized information injected by an active settling error canceller circuit (i.e., one of the first settling error canceller circuit and the second settling error canceller circuit) can cancel the settling error $(1-k)*V_O(t0)$. To put it simply, since the polarity and magnitude of the settling error $(1-k)*V_O(t0)$ of the sampler circuit 1002 can be estimated through an online training process, the magnitude of cancellation weighting $$\frac{C_{SC}}{C_S + C_{SC}}$$

can be properly set by tuning the capacitance value $C_{SC}$ according to the magnitude of the settling error $(1-k)*V_O(t0)$ to be cancelled.

Figure 11:
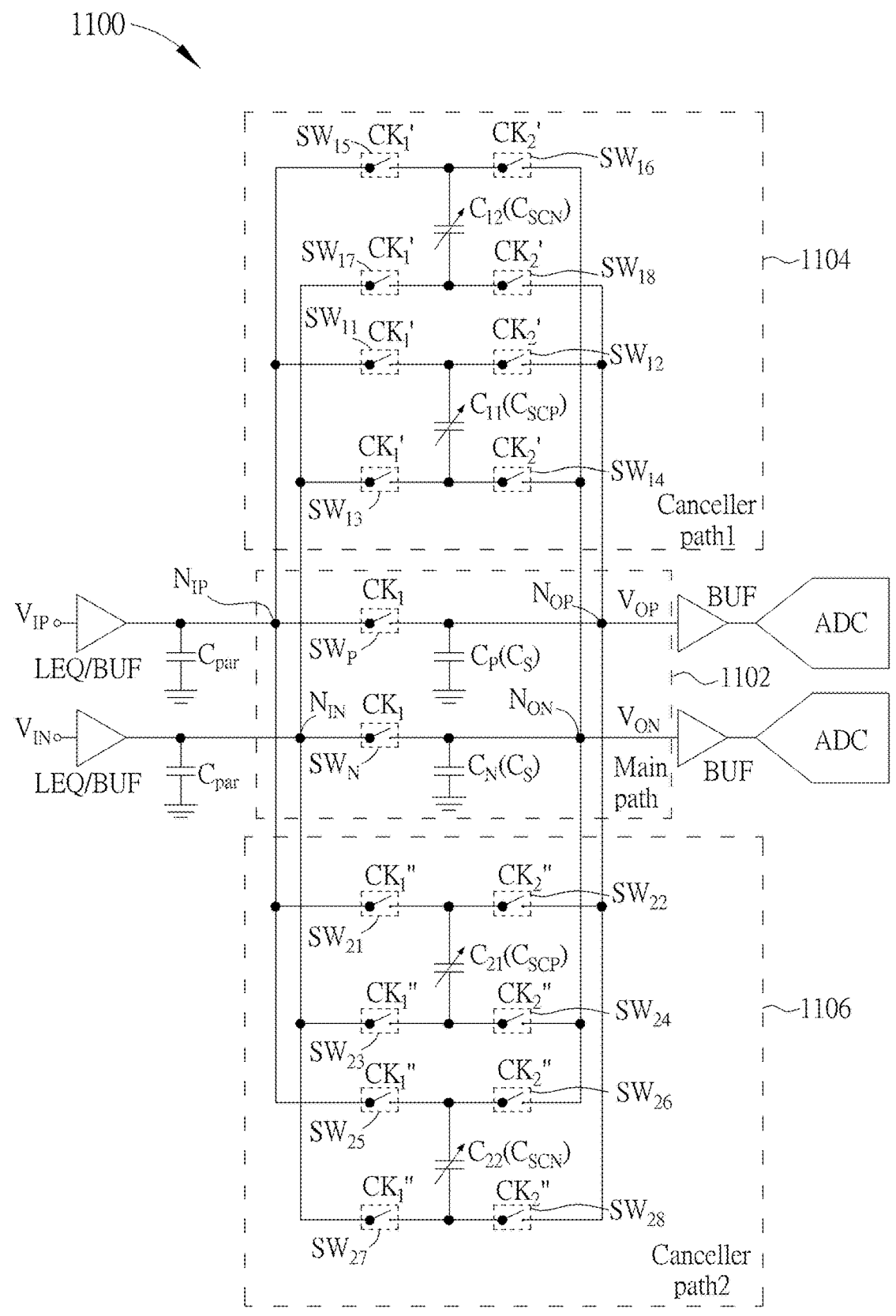
FIG. 11 is a diagram illustrating a seventh sampling system with settling error cancellation according to an embodiment of the present invention.

FIG. 11 is a diagram illustrating a seventh sampling system with settling error cancellation according to an embodiment of the present invention. The sampling system 1100 includes a sampler circuit 1102 located at a main path, a first settling error canceller circuit 1104 located at a first canceller path (labeled by "canceller path1"), and a second settling error canceller circuit 1106 located at a second canceller path (labeled by "canceller path2"). Each of the sampler circuit 1102, the first settling error canceller circuit 1104, and the second settling error canceller circuit 1106 is coupled between an input port and an output port of the sampling system 1100. In this embodiment, the sampling system 1100 is a differential operation network. Hence, the input port is a differential input port having a positive input node $N_{IP}$ and a negative input node $N_{IN}$, the output port is a differential output port having a positive output node $N_{OP}$ and a negative output node $N_{ON}$, a voltage input derived from the input port is a differential voltage input having a positive voltage signal $V_{IP}$ (which is driven by one LEQ/BUF) and a negative voltage signal $V_{IN}$ (which is driven by another LEQ/BUF), and a voltage output generated from the output port is a differential voltage output having a positive voltage signal $V_{OP}$ (which is provided to one ADC via one BUF) and a negative voltage signal $V_{ON}$ (which is provided to another ADC via another BUF).

The sampler circuit 1102 includes a plurality of sampling capacitors $C_P$ and $C_N$ and a plurality of switches (e.g., transistor switches) $SW_P$ and $SW_N$. The sampling capacitor $C_P$ has a first end (top plate) and a second end (bottom plate), where the second end is coupled to a reference voltage (e.g., ground voltage GND). The sampling capacitor $C_N$ has a first end (top plate) and a second end (bottom plate), where the second end is coupled to the reference voltage (e.g., ground voltage GND). The sampling capacitors $C_P$ and $C_N$ have the same capacitance value $C_S$. The switch $SW_P$ is controlled by a clock signal $CK_1$, and coupled between the first end of the sampling capacitor $C_P$ and the positive input node $N_{IP}$. The switch $SW_N$ is controlled by the clock signal $CK_1$, and coupled between the first end of the sampling capacitor $C_N$ and the negative input node $N_{IN}$.

The first settling error canceller circuit 1104 includes a plurality of sampling capacitors (e.g., variable capacitors) $C_1$, $C_{12}$ and a plurality of switches (e.g., transistor switches) $SW_{11}$, $SW_{12}$, $SW_{13}$, $SW_{14}$, $SW_{15}$, $SW_{16}$, $SW_{17}$, $SW_{18}$, where the sampling capacitor $C_{11}$ has a capacitance value $C_{SCP}$, and the sampling capacitor $C_{12}$ has a capacitance value $C_{SCN}$ ($C_{SCN} \neq C_{SCP}$). Each of the sampling capacitors $C_{11}$ and $C_{12}$ has a first end (top plate) and a second end (bottom plate). Compared to the first settling error canceller circuit used in the sampling system 100, the first settling error canceller circuit used in the sampling system 1100 requires fewer sampling capacitors.

The switch $SW_{11}$ is controlled by a clock signal $CK_1'$, and coupled between the first end of the sampling capacitor $C_{11}$ and the positive input node $N_{IP}$. The switch $SW_{12}$ is controlled by a clock signal $CK_2'$, and coupled between the first end of the sampling capacitor $C_{11}$ and the positive output node $N_{OP}$. The switch $SW_{13}$ is controlled by the clock signal $CK_1'$, and coupled between the second end of the sampling capacitor $C_{11}$ and the negative input node $N_{IN}$. The switch $SW_{14}$ is controlled by the clock signal $CK_2'$, and coupled between the second end of the sampling capacitor $C_{11}$ and the negative output node $N_{ON}$. The switch $SW_{15}$ is controlled by the clock signal $CK_1'$, and coupled between the first end of the sampling capacitor Cis and the positive input node $N_{IP}$. The switch $SW_{16}$ is controlled by the clock signal $CK_2'$, and coupled between the first end of the sampling capacitor $C_{12}$ and the negative output node $N_{ON}$. The switch $SW_{17}$ is controlled by the clock signal $CK_1'$, and coupled between the second end of the sampling capacitor $C_{12}$ and the negative input node $N_{IN}$. The switch $SW_{18}$ is controlled by the clock signal $CK_2'$, and coupled between the second end of the sampling capacitor $C_{12}$ and the positive output node $N_{OP}$.

The second settling error canceller circuit 1106 includes a plurality of sampling capacitors (e.g., variable capacitors) $C_{21}$, $C_{22}$ and a plurality of switches (e.g., transistor switches) $SW_{21}$, $SW_{22}$, $SW_{23}$, $SW_{24}$, $SW_{25}$, $SW_{26}$, $SW_{27}$, $SW_{28}$, where the sampling capacitor $C_{21}$ has the capacitance value $C_{SCP}$, and the sampling capacitor $C_{22}$ has the capacitance value $C_{SCN}$ ($C_{SCN} \neq C_{SCP}$). Each of the sampling capacitors $C_{21}$ and $C_{22}$ has a first end (top plate) and a second end (bottom plate). Compared to the second settling error canceller circuit used in the sampling system 100, the second settling error canceller circuit used in the sampling system 1100 requires fewer sampling capacitors.

The switch $SW_{21}$ is controlled by a clock signal $CK_1''$, and coupled between the first end of the sampling capacitor $C_{21}$ and the positive input node $N_{IP}$. The switch $SW_{22}$ is controlled by a clock signal $CK_2''$, and coupled between the first end of the sampling capacitor $C_{21}$ and the positive output node $N_{OP}$. The switch $SW_{23}$ is controlled by the clock signal $CK_1''$, and coupled between the second end of the sampling capacitor $C_{21}$ and the negative input node $N_{IN}$. The switch $SW_{24}$ is controlled by the clock signal $CK_2''$, and coupled between the second end of the sampling capacitor $C_{21}$ and the negative output node $N_{ON}$. The switch $SW_{25}$ is controlled by the clock signal $CK_1''$, and coupled between the first end of the sampling capacitor $C_{22}$ and the positive input node $N_{IP}$. The switch $SW_{26}$ is controlled by the clock signal $CK_2''$, and coupled between the first end of the sampling capacitor $C_{22}$ and the negative output node $N_{ON}$. The switch $SW_{27}$ is controlled by the clock signal $CK_1''$, and coupled between the second end of the sampling capacitor $C_{22}$ and the negative input node $N_{IN}$. The switch $SW_{28}$ is controlled by the clock signal $CK_2''$, and coupled between the second end of the sampling capacitor $C_{22}$ and the positive output node $N_{OP}$.

As mentioned above, the settling error cancellation operation can be divided into four phases P1, P2, P3, P4. Specifically, the phases P1, P2, P3, P4 are enabled sequentially and cyclically, resulting in a sequence of . . . $\rightarrow$P1$\rightarrow$P2$\rightarrow$P3$\rightarrow$P4$\rightarrow$P1$\rightarrow$P2$\rightarrow$P3$\rightarrow$P4$\rightarrow$ . . . . Clock signals with waveforms shown in FIG. 2 can be used by the sampling system 1100. During the first phase P1 of the settling error cancellation operation, the switches $SW_P$, $SW_N$, $SW_{11}$, $SW_{13}$, $SW_{15}$, $SW_{17}$ are switched on, and the switches $SW_{12}$, $SW_{14}$, $SW_{16}$, $SW_{18}$, $SW_{21}$-$SW_{28}$ are switched off. During the second phase P2 of the settling error cancellation operation, the switches $SW_{22}$, $SW_{24}$, $SW_{26}$, $SW_{28}$ are switched on, and the switches $SW_P$, $SW_N$, $SW_{11}$-$SW_{18}$, $SW_{21}$, $SW_{23}$, $SW_{25}$, $SW_{27}$ are switched off. During the third phase P3 of the settling error cancellation operation, the switches $SW_P$, $SW_N$, $SW_{21}$, $SW_{23}$, $SW_{25}$, $SW_{27}$ are switched on, and the switches $SW_{22}$, $SW_{24}$, $SW_{26}$, $SW_{28}$, $SW_{11}$-$SW_{18}$ are switched off. During the fourth phase P4 of the settling error cancellation operation, the switches $SW_{12}$, $SW_{14}$, $SW_{16}$, $SW_{18}$ are switched on, and the switches $SW_P$, $SW_N$, $SW_{21}$-$SW_{28}$, $SW_{11}$, $SW_{13}$, $SW_{15}$, $SW_{17}$ are switched off.

The settling error cancelation is achieved by charge redistribution at phase P2 (or P4) according to memorized information obtained at previous phase P3 (or P1). Hence, a percentage of the memorized information obtained at previous sampling phase P3 (or P1) that should be used to cancel a settling error occurring at a current sampling phase P2 (or P4) depends on the cancellation weighting $$\frac{C_{SCP} - C_{SCN}}{C_S + C_{SCP} + C_{SCN}}.$$

In a case where the sampler circuit 1102 at the main path suffers a settling error $(1-k)*V_O(t0)$ with negative polarity, the capacitance value $C_{SCP}$ is set to be larger than that of the capacitance value $C_{SCN}$, which results in $(C_{SCP}-C_{SCN})>0$. In addition, the capacitance values $C_{SCP}$ and $C_{SCN}$ are properly set to ensure that a fraction of the memorized information injected by an active settling error canceller circuit (i.e., one of the first settling error canceller circuit and the second settling error canceller circuit) can cancel the settling error $(1-k)*V_O(t0)$. In another case where the sampler circuit 1102 at the main path suffers a settling error $(1-k)*V_O(t0)$ with positive polarity, the capacitance value $C_{SCP}$ is set to be smaller than that of the capacitance value $C_{SCN}$, which results in $(C_{SCP}-C_{SCN})<0$. In addition, the capacitance values $C_{SCP}$ and $C_{SCN}$ are properly set to ensure that a fraction of the memorized information injected by an active settling error canceller circuit (i.e., one of the first settling error canceller circuit and the second settling error canceller circuit) can cancel the settling error $(1-k)*V_O(t0)$. To put it simply, since the polarity and magnitude of the settling error $(1-k)*V_O(t0)$ of the sampler circuit 1102 can be estimated through an online training process, the polarity and magnitude of cancellation weighting $$\frac{C_{SCP} - C_{SCN}}{C_S + C_{SCP} + C_{SCN}}$$

can be properly set by tuning the capacitance values $C_{SCP}$ and $C_{SCN}$ according to the polarity and magnitude of the settling error $(1-k)*V_O(t0)$ to be cancelled.

It should be noted that, compared to embodiments shown in FIGS. 3, 5, 6, 8, and 10, embodiments shown in FIG. 1 and FIG. 11 may have higher error cancellation precision due to the fact that the numerator $(C_{SCP}-C_{SCN})$ of the cancellation weighting can be set by a value smaller than $C_{SC}$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sampling system comprising:
   a sampler circuit, coupled between an input port and an output port of the sampling system, wherein the sampler circuit comprises at least one sampling capacitor;
   a first settling error canceller circuit, coupled between the input port and the output port of the sampling system, wherein the first settling error canceller circuit comprises at least one first sampling capacitor; and
   a second settling error canceller circuit, coupled between the input port and the output port of the sampling system, wherein the second settling error canceller circuit comprises at least one second sampling capacitor;
   wherein during a first phase of a settling error cancellation operation, the sampler circuit is arranged to sample a voltage input derived from the input port at the at least one sampling capacitor, the first settling error canceller circuit is arranged to sample the voltage input derived from the input port at the at least one first sampling capacitor, and the second settling error canceller circuit is arranged to hold its sampling result at the at least one second sampling capacitor;
   during a second phase of the settling error cancellation operation that is a next phase of the first phase, the sampler circuit and the second settling error canceller circuit are arranged to perform charge redistribution between the at least one sampling capacitor and the at least one second sampling capacitor, and the first settling error canceller circuit is arranged to hold its sampling result at the at least one first sampling capacitor;
   during a third phase of the settling error cancellation operation that is a next phase of the second phase, the sampler circuit is arranged to sample the voltage input derived from the input port at the at least one sampling capacitor, the second settling error canceller circuit is arranged to sample the voltage input derived from the input port at the at least one second sampling capacitor, and the first settling error canceller circuit is arranged to hold its sampling result at the at least one first sampling capacitor; and during a fourth phase of the settling error cancellation operation that is a next phase of the third phase, the sampler circuit and the first settling error canceller circuit are arranged to perform charge redistribution between the at least one sampling capacitor and the at least one first sampling capacitor, and the second settling error canceller circuit is arranged to hold its sampling result at the at least one second sampling capacitor.

2. The sampling system of claim 1, wherein the input port is a differential input port having a positive input node and a negative input node, the output port is a differential output port having a positive output node and a negative output node, and the voltage input is a differential voltage input having a positive voltage signal and a negative voltage signal.

3. The sampling system of claim 2, wherein the at least one first sampling capacitor comprises a first capacitor, a second capacitor, a third capacitor, and a fourth capacitor; and the first settling error canceller circuit comprises:

the first capacitor, having a first end and a second end, wherein the second end of the first capacitor is coupled to a reference voltage;

the second capacitor, having a first end and a second end, wherein the second end of the second capacitor is coupled to the reference voltage;

the third capacitor, having a first end and a second end, wherein the second end of the third capacitor is coupled to the reference voltage;

the fourth capacitor, having a first end and a second end, wherein the second end of the fourth capacitor is coupled to the reference voltage;

a first switch, coupled between the first end of the first capacitor and the positive input node;

a second switch, coupled between the first end of the first capacitor and the positive output node;

a third switch, coupled between the first end of the second capacitor and the positive input node;

a fourth switch, coupled between the first end of the second capacitor and the negative output node;

a fifth switch, coupled between the first end of the third capacitor and the negative input node;

a sixth switch, coupled between the first end of the third capacitor and the positive output node;

a seventh switch, coupled between the first end of the fourth capacitor and the negative input node; and an eighth switch, coupled between the first end of the fourth capacitor and the negative output node.

4. The sampling system of claim 3, wherein during the first phase of the settling error cancellation operation, the first, third, fifth, and seventh switches are switched on, and the second, fourth, sixth, and eighth switches are switched off; during the second phase and the third phase of the settling error cancellation operation, the first to eighth switches are switched off; and during the fourth phase of the settling error cancellation operation, the first, third, fifth, and seventh switches are switched off, and the second, fourth, sixth, and eighth switches are switched on.

5. The sampling system of claim 2, wherein the at least one first sampling capacitor comprises a first capacitor and a second capacitor; and the first settling error canceller circuit comprises:

the first capacitor, having a first end and a second end, wherein the second end of the first capacitor is coupled to a reference voltage;

the second capacitor, having a first end and a second end, wherein the second end of the second capacitor is coupled to the reference voltage;

a first switch, coupled between the first end of the first capacitor and the positive input node;

a second switch, coupled between the first end of the first capacitor and the positive output node;

a third switch, coupled between the first end of the first capacitor and the negative output node;

a fourth switch, coupled between the first end of the second capacitor and the negative input node;

a fifth switch, coupled between the first end of the second capacitor and the negative output node; and a sixth switch, coupled between the first end of the second capacitor and the positive output node.

6. The sampling system of claim 5, wherein during the first phase of the settling error cancellation operation, the first switch and the fourth switch are switched on, and the second, third, fifth, and sixth switches are switched off; during the second phase and the third phase of the settling error cancellation operation, the first to sixth switches are switched off; and during the fourth phase of the settling error cancellation operation, the second switch and the fifth switch are switched on, and the first, third, fourth, and sixth switches are switched off.

7. The sampling system of claim 5, wherein during the first phase of the settling error cancellation operation, the first and fourth switches are switched on, and the second, third, fifth, and sixth switches are switched off; during the second phase and the third phase of the settling error cancellation operation, the first to sixth switches are switched off; and during the fourth phase of the settling error cancellation operation, the third switch and the sixth switch are switched on, and the first, second, fourth, and fifth switches are switched off.

8. The sampling system of claim 2, wherein the at least one first sampling capacitor comprises a capacitor; and the first settling error canceller circuit comprises:

the capacitor, having a first end and a second end;

a first switch, coupled between the first end of the capacitor and the positive input node;

a second switch, coupled between the first end of the capacitor and the positive output node;

a third switch, coupled between the first end of the capacitor and the negative output node;

a fourth switch, coupled between the second end of the capacitor and the negative input node;

a fifth switch, coupled between the second end of the capacitor and the negative output node; and a sixth switch, coupled between the second end of the capacitor and the positive output node.

9. The sampling system of claim 8, wherein during the first phase of the settling error cancellation operation, the first switch and the fourth switch are switched on, and the second, third, fifth, and sixth switches are switched off; during the second phase and the third phase of the settling error cancellation operation, the first to sixth switches are switched off; and during the fourth phase of the settling error cancellation operation, the second switch and the fifth switch are switched on, and the first, third, fourth, and sixth switches are switched off.

10. The sampling system of claim 8, wherein during the first phase of the settling error cancellation operation, the first switch and the fourth switch are switched on, and the second, third, fifth, and sixth switches are switched off; during the second phase and the third phase of the settling error cancellation operation, the first to sixth switches are switched off; and during the fourth phase of the settling error cancellation operation, the third switch and the sixth switch are switched on, and the first, second, fourth, and fifth switches are switched off.

11. The sampling system of claim 2, wherein the at least one first sampling capacitor comprises a first capacitor and a second capacitor; and the first settling error canceller circuit comprises:

the first capacitor, having a first end and a second end;

the second capacitor, having a first end and a second end;

a first switch, coupled between the first end of the first capacitor and the positive input node;

a second switch, coupled between the first end of the first capacitor and the positive output node;

a third switch, coupled between the second end of the first capacitor and the negative input node;

a fourth switch, coupled between the second end of the first capacitor and the negative output node;

a fifth switch, coupled between the first end of the second capacitor and the positive input node;

a sixth switch, coupled between the first end of the second capacitor and the negative output node;

a seventh switch, coupled between the second end of the second capacitor and the negative input node; and an eighth switch, coupled between the second end of the second capacitor and the positive output node.

12. The sampling system of claim 11, wherein during the first phase of the settling error cancellation operation, the first, third, fifth, and seventh switches are switched on, and the second, fourth, sixth, and eighth switches are switched off; during the second phase and the third phase of the settling error cancellation operation, the first to eighth switches are switched off; and during the fourth phase of the settling error cancellation operation, the first, third, fifth, and seventh switches are switched off, and the second, fourth, sixth, and eighth switches are switched on.

13. The sampling system of claim 1, wherein the input port is a single-ended input port having a single input node, the output port is a single-ended output port having a single output node, and the voltage input is a single-ended voltage input having a single voltage signal.

14. The sampling system of claim 13, wherein the at least one first sampling capacitor comprises a first capacitor and a second capacitor; the system a sampling further comprises negative-unity-gain amplifier, having an amplifier input node and an amplifier output node, wherein the amplifier input node is coupled to the single input node; and the first settling error canceller circuit comprises:

the first capacitor, having a first end and a second end, wherein the second end of the first capacitor is coupled to a reference voltage;

the second capacitor, having a first end and a second end, wherein the second end of the second capacitor is coupled to the reference voltage;

a first switch, coupled between the first end of the first capacitor and the single input node;

a second switch, coupled between the first end of the first capacitor and the single output node;

a third switch, coupled between the first end of the second capacitor and the amplifier output node; and a fourth switch, coupled between the first end of the second capacitor and the single output node.

15. The sampling system of claim 14, wherein during the first phase of the settling error cancellation operation, the first switch is switched on, and the second to fourth switches are switched off; during the second phase and the third phase of the settling error cancellation operation, the first to fourth switches are switched off; and during the fourth phase of the settling error cancellation operation, the second switch is switched on, and the first, third, and fourth switches are switched off.

16. The sampling system of claim 14, wherein during the first phase of the settling error cancellation operation, the third switch is switched on, and the first, second, and fourth switches are switched off; during the second phase and the third phase of the settling error cancellation operation, the first to fourth switches are switched off; and during the fourth phase of the settling error cancellation operation, the fourth switch are switched on, and the first to third switches are switched off.

17. The sampling system of claim 13, wherein the at least one first sampling capacitor comprises a capacitor; and the first settling error canceller circuit comprises:

the capacitor, having a first end and a second end, wherein the second end of the capacitor is coupled to a reference voltage;

a first switch, coupled between the first end of the capacitor and the single input node; and a second switch, coupled between the first end of the capacitor and the single output node.

18. The sampling system of claim 17, wherein during the first phase of the settling error cancellation operation, the first switch is switched on, and the second switch is switched off; during the second phase and the third phase of the settling error cancellation operation, the first switch and the second switch are switched off; and during the fourth phase of the settling error cancellation operation, the second switch is switched on, and the first switch is switched off.

19. The sampling system of claim 13, wherein the at least one first sampling capacitor comprises a capacitor; the sampling system further comprises a negative-unity-gain amplifier, having an amplifier input node and an amplifier output node, wherein the amplifier input node is coupled to the single input node; and the first settling error canceller circuit comprises:

the capacitor, having a first end and a second end, wherein the second end of the capacitor is coupled to a reference voltage;

a first switch, coupled between the first end of the capacitor and the single input node;

a second switch, coupled between the first end of the capacitor and the amplifier output node; and a third switch, coupled between the first end of the capacitor and the single output node.

20. The sampling system of claim 19, wherein during the first phase of the settling error cancellation operation, the first switch is switched on, and the second switch and the third switch are switched off; during the second phase and the third phase of the settling error cancellation operation, the first to third switches are switched off; and during the fourth phase of the settling error cancellation operation, the third switch is switched on, and the first switch and the second switch are switched off.

21. The sampling system of claim 19, wherein during the first phase of the settling error cancellation operation, the second switch is switched on, and the first switch and the third switch are switched off; during the second phase and the third phase of the settling error cancellation operation, the first to third switches are switched off; and during the fourth phase of the settling error cancellation operation, the third switch is switched on, and the first switch and the second switch are switched off.

\* \* \* \* \*